United States Patent [19]

Kodama et al.

[11] Patent Number: 5,447,816

[45] Date of Patent: * Sep. 5, 1995

[54] METHOD FOR FORMING A THIN PROTECTION FILM

[75] Inventors: Jun Kodama, Kawasaki; Shin Araki, Yokohama, both of Japan

[73] Assignee: Fujitsu Limited, Kawasaki, Japan

[ * ] Notice: The portion of the term of this patent subsequent to Jun. 16, 2009 has been disclaimed.

[21] Appl. No.: 756,590

[22] Filed: Sep. 9, 1991

Related U.S. Application Data

[63] Continuation of Ser. No. 405,297, Sep. 11, 1989, Pat. No. 5,122,431.

[30] Foreign Application Priority Data

Sep. 14, 1988 [JP] Japan ................................ 63-228806
Feb. 16, 1989 [JP] Japan ................................ 1-034987
Feb. 27, 1989 [JP] Japan ................................ 1-043269

[51] Int. Cl.$^6$ ............................................ G03G 5/14
[52] U.S. Cl. ................................... 430/128; 427/575
[58] Field of Search ................... 430/128; 427/575; 423/346

[56] References Cited

U.S. PATENT DOCUMENTS

| | | | |
|---|---|---|---|
| 4,717,585 | 1/1988 | Ishihara et al. | 427/39 |
| 4,772,486 | 9/1988 | Ishihara et al. | 427/39 |
| 5,122,431 | 6/1992 | Kodama et al. | 430/128 |

FOREIGN PATENT DOCUMENTS

| | | |
|---|---|---|
| 0229707 | 7/1987 | European Pat. Off. . |
| 0242317 | 7/1987 | European Pat. Off. . |
| 0230788 | 8/1987 | European Pat. Off. . |
| 3525211 | 1/1986 | Germany . |

OTHER PUBLICATIONS

Patent Abstracts of Japan, vol. 8, No. 281 (E-286) [1718], 21st Dec. 1984; & JP-A-59 148 326 (Sumitomo Denki K.K.) 25-Aug. 14 1984. Whole document.

Proceedings of the Eight E. C. Photovoltaic Solar Energy Conference, Florence, 9th–13th May 1988, vol. 2, pp. 1211–1219, Kluwer Academic Publishers, Dordrecht, NL; Y Hamakawa: "Electron cyclotron resonance CVD of a–SiC alloy and its application to opto-electronic devices". Whole Document.

Thin Solid Films, vol. 101, No. 1, Mar. 1983, pp. 83–96, Elsevier Sequoia, Lausanne, CH; J. P. Gerault et al.: "X–ray photoelectron spectroscopy and raman spectroscopy investigations of amorphous $Si_xCl_{1-x}(H)$ coatings obtained by chemical vapour deposition from thermally labile organosilicon compounds". Whole document.

*Primary Examiner*—John Goodrow
*Attorney, Agent, or Firm*—Staas & Halsey

[57] ABSTRACT

A method for forming a dense, carrier blocking, thin protective film of a hydrogenated amorphous material containing an ingredient to reduce surface wetting on an a-Si:H photosensitive member. The method includes forming the protective film by generating a plasma of a starting gas suitable for forming the hydrogenated amorphous material within a deposition space where the photosensitive member is positioned under vapor deposition conditions. Hydrogen radicals are generated by decomposing hydrogen gas. The quantity of dangling bonds at the surface of the amorphous material film is reduced to thereby increase the density of the film by introducing a sufficient amount of the hydrogen radicals into the deposition space in the proximity of the photosensitive member to cover the surface of the amorphous material film as it forms.

3 Claims, 23 Drawing Sheets

METHOD FOR FORMING A THIN PROTECTION FILM

This application is a continuation of application No. 07/405,297, filed Sep. 11, 1989, now U.S. Pat. No. 5,122,437.

BACKGROUND OF THE INVENTION

1. Field of the Invention

The present invention relates to methodology and apparatus for forming thin film hydrogenated amorphous material, for example, hydrogenated amorphous silicon, hydrogenated amorphous carbon, hydrogenated amorphous silicon carbide and thin film transistor (TFT) material.

2. Description of the Related Art

Thin film hydrogenated amorphous materials, particularly materials formed from hydrogenated amorphous silicon (hereinafter referred to as a-Si:H) are widely used as electrophotographic photosensitive members for electrophotographic apparatus to form images upon irradiation with an information light beam since such materials have excellent durability and are not sources of environmental pollution.

As shown in FIG. 1, a photosensitive member consisting of a blocking layer 103 for carrier injection, a carrier generation and transport layer 104 and a surface protecting layer 105 layered sequentially onto a conductive substrate 100 such as aluminum (A1).

Blocking layer 103 for carrier injection is formed from a P type or N type a-Si:H, a-SiO:H, a-SiC:H or a-SiN:H material, and photosensitive layer 104 is formed from an a-Si:H material. The surface protecting layer 105 is made from a-SiC:H, a-SiN:H or a-SiC:H:F. Particularly, for the surface protecting layer 105, and a-SiC:H or a-SiN:H material having a wide band gap is used but a-SiC:H is superior from a hardness viewpoint.

However, Si in the surface layer reacts with oxygen in the air to form SiO which is hydrophilic and blurring may thus result under high humidity conditions.

Therefore, in the past the photosensitive materials have been heated or films which do not contain Si in the surface layer have been employed.

However, in cases where the photosensitive member is heated, it is necessary to include a heating source in the electrophotographic apparatus, thereby complicating the configuration of the electrophotographic apparatus and increasing its cost.

On the other hand, when the surface layer does not include Si, light transmissivity, hardness and suitability for use as a photosensitive member are diminished.

SUMMARY OF THE INVENTION

It is an object of the present invention to provide a photosensitive a-SiC:H material which assures high light transmissivity, hardness and suitability for use as a photosensitive member and which is able to resist blurring under high humidity conditions without using a heating source.

Accordingly, the present invention provides a hydrogenated amorphous silicon carbide having a general formula a-Si$_{1-x}$C$_x$:H wherein the ratio of the TO peak amplitude appearing in the vicinity of 480 cm$^{-1}$ observed by laser Raman spectroscopy measurement using an Ar+ 488 nm excitation laser to the TA peak amplitude appearing in the vicinity of 150 cm$^{-1}$ is 2.0 or more and the carbon content (x) is in the range of 0.4 to 0.8.

In accordance with the invention, investigations have been conducted to determine the surface behavior of an a-Si:H photosensitive member subjected to corona irradiation under high humidity conditions by measurement of the contact angle using high sensitivity reflection FT-IR (IR-RAS) techniques. These investigations have shown that corona irradiation of the surface protecting layer of an a-Si:H photosensitive member under high humidity conditions causes an increase of Si-OH, HO-OH, Si-O-Si, NO$_3$- and CO$_3$-- at the surface, thereby enhancing wettability. Ozone (O$_3$) generated by corona irradiation directly oxidizes the surface of the photosensitive member and increases Si-O-Si coupling. Simultaneously, absorption groups such as NO$_3$-, CO$_3$-- and OH are generated and such absorption groups adhere to Si at the surface as hydrates. As a result, surface polarity and thus surface wettability are increased because the polar H$_2$O molecules tend to adhere to the surface. When the surface is charged under such condition, charges flow and therefore blurring occurs. In accordance with the present invention, wettability is improved (decreasing) by increasing the carbon content in a-Si$_{1-x}$C$_x$:H films of the type that are used currently as the surface protecting layer because, as explained above, it is not practical to employ materials that do not include Si at the surface to provide an a-Si photosensitive member which is resistive to humidity.

Moreover, a-Si$_{1-x}$C$_x$:H materials having only a high carbon content do not necessarily have sufficient carrier injection blocking capability to be used as the surface protecting layer. Therefore, the present invention provides an a-Si$_{1-x}$C$_x$:H material with a carbon content (x>0.4) which provides a value of 2.0 or more as the ratio of peak TO amplitude appearing in the vicinity of 480 cm$^{-1}$ observed by laser Raman spectroscopy measurement using an Ar 488 nm excitation laser to the peak TA amplitude appearing in the vicinity of 150 cm$^{-1}$. Such material enables the provision of an a-Si$_{1-x}$C$_x$:H film which has a high carbon content and sufficient blocking functionability to perform as the surface protecting layer.

It is known that a-Si$_{1-x}$C$_x$:H films having high carbon content (x≧0.5) can be formed using the well known RF-CVD (Radio Frequency Chemical Vapor Deposition) apparatus (see, for example, U.S. Pat. No. 4,507,375, and page 452 of "Electrophotographic Bases and Application" issued in 1988 by Corona Publishing Corp.). However, there is no mention in these publications of the use of such films as blocking layers and the disclosed films would not allow the application of charging voltages because the density of film is deteriorated.

FIG. 2 is a schematic diagram showing the arrangement of an RF-CVD apparatus of the prior art.

In FIG. 2, a substrate 100 suitable for having an a-SiC:H film formed thereon is mounted on an electrode 27 connected to the ground in the reactor vessel 26. Reactor vessel 26 is evacuated by a rotary pump 33 and a mechanical booster pump 32 connected to an outlet port 116. Meanwhile, the reactor vessel 26 is connected to a pipe 118 at inlet port 114. Pipe 118 is then connected to a gas cylinder 1 containing disilane Si$_2$H$_6$ through a flow regulator 5a, to a gas cylinder 2 containing propane C$_3$H$_8$ through a flow regulator 5b, to a gas cylinder 3 containing hydrogen H$_2$ through a flow regulator 5c and to a gas cylinder 4 containing argon Ar through a flow regulator 5d.

The gases contained in gas cylinders 1, 2, 3 and 4 are introduced into reactor 26 through pipe 118 for use as starting gases only in the quantities dictated by the adjustments of the respective flow regulators 5a, 5b, 5c and 5d.

As the starting gases are introduced into the reactor 26 the radio frequency power is supplied to the first electrode 29 from the radio frequency power source 31 and a plasma of starting gases is formed across the first and second electrodes 27, 29 and an a-SiC:H film is thus formed on the substrate 100.

The RF-CVD apparatus as described above may be used to form an a-$Si_{1-x}C_x$:H film having high content (x) of carbon simply by increasing the flow rate of propane $C_3H_8$ from gas cylinder 2, but the a-$Si_{1-x}C_x$:H film thus formed is not able to function as a blocking layer.

Accordingly, it is another object of the present invention to provide a method and apparatus for forming an a-$Si_{1-x}C_x$:H film having the characteristics described above.

Therefore, according to the present invention, an apparatus for forming hydrogenated amorphous silicon carbide film is provided which comprises a reactor vessel, means for introducing starting gases to the reactor vessel, means for generating plasma from the starting gases within the reactor vessel, separate means for introducing hydrogen gas into the reactor vessel and means for generating hydrogen radicals from the hydrogen gas introduced by the separate means.

In accordance with the invention, long life hydrogen radicals (·H) are generated by the decomposition of hydrogen gas ($H_2$) using a microwave frequency (2.45 GHz, for example), and such radicals are sent into the reactor vessel and into the deposition space where the plasma is formed by decomposition of the starting gases. It is theorized that the density of the deposited film is improved when the reaction surface is effectively covered with hydrogen radicals (·H).

Atom coupling energy is as follows:

| H—H | > | C—H | > | C—C | > | Si—C | > | Si—Si | > | Si—H |
|---|---|---|---|---|---|---|---|---|---|---|
| 4.88eV | | 4.29eV | | 3.58eV | | 3.38eV | | 3.10eV | | 3.06eV |

To increase the density of an a-$Si_{1-x}C_x$:H film during formation it is believed that the quantity of dangling Si atom bonds should be reduced. On the other hand, an increased bond ratio x causes a larger quantity of hydrogen to be coupled with carbon because of the coupling energy relationships described above, and as a result of the increased hydrogen-carbon coupling it is believed that the quantity of dangling Si atoms bonds correspondingly increases and the film is thereby deteriorated. In order to prevent such phenomenon, the presence of dangling Si atom bonds is decreased, in accordance with the invention, by covering the reaction surface with an excess of hydrogen radicals (·H) and Si-C coupling is increased as a result of the increased amount of H-H re-coupling thus generated at the surface. Accordingly, the density of the film can be increased. In the past it has been proposed that the density of the film can be increased by reducing hydrogen ($H_2$), but it has been found in accordance with the present invention that the blocking characteristics of an a-SiC:H film are not good when carbon content is high. However, when hydrogen ($H_2$) is replaced by hydrogen radicals (·H), such radicals easily cover the surface because they are more active than hydrogen ($H_2$) and the density of the film can be increased even for films having higher contents of carbon.

The above and further objects and novel features of the invention will more fully appear from the following detailed description when the same is read in connection with the accompanying drawings. It is to be expressly understood, however, that the drawings are for purposes of illustration only and are not intended as a definition of the limits of the invention.

DESCRIPTION OF THE PREFERRED EMBODIMENT

Figure 3:
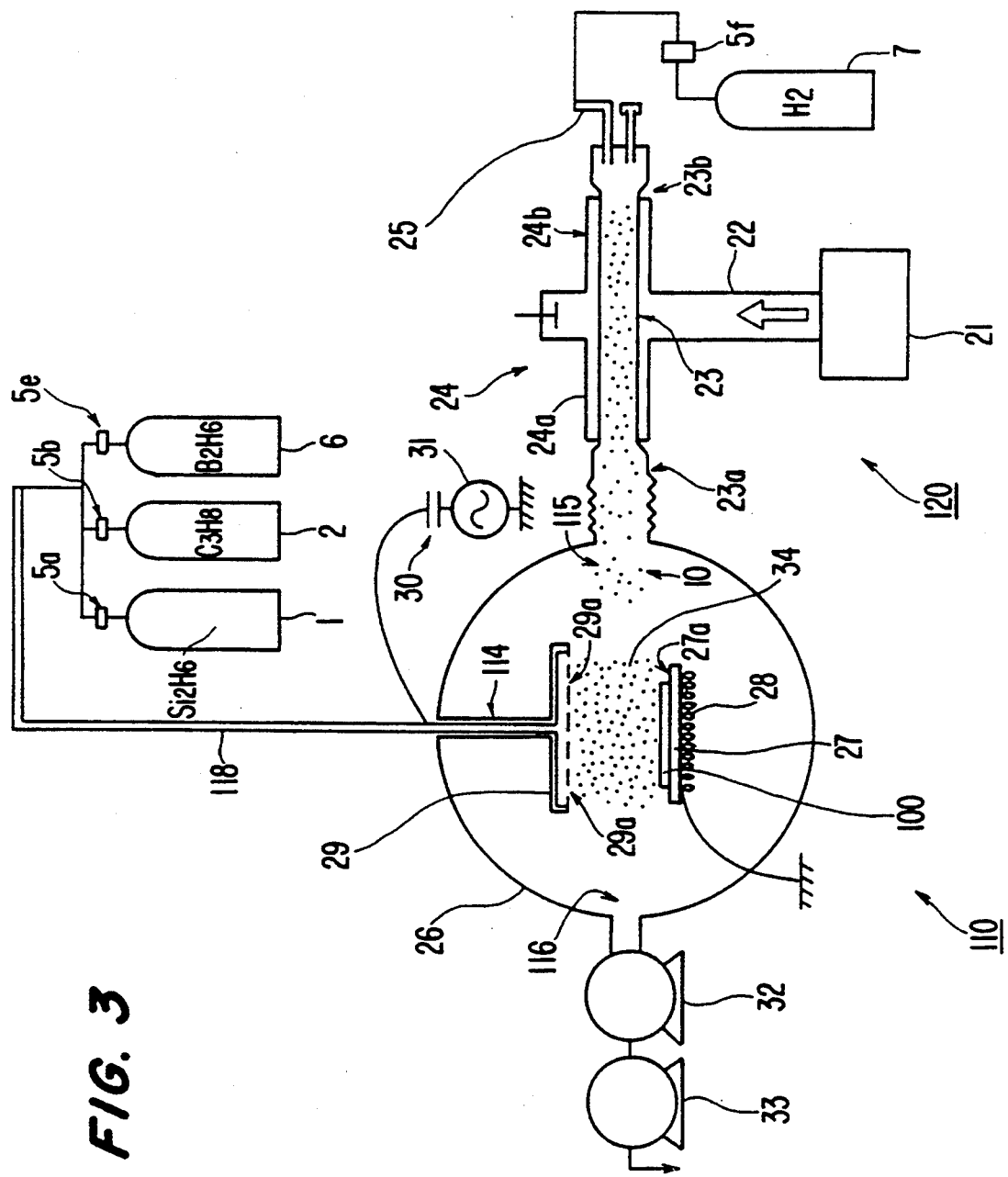
FIG. 3 is a schematic diagram illustrating the components of a thin film formation apparatus which embodies the principles and concepts of the present invention.
Figure 4:
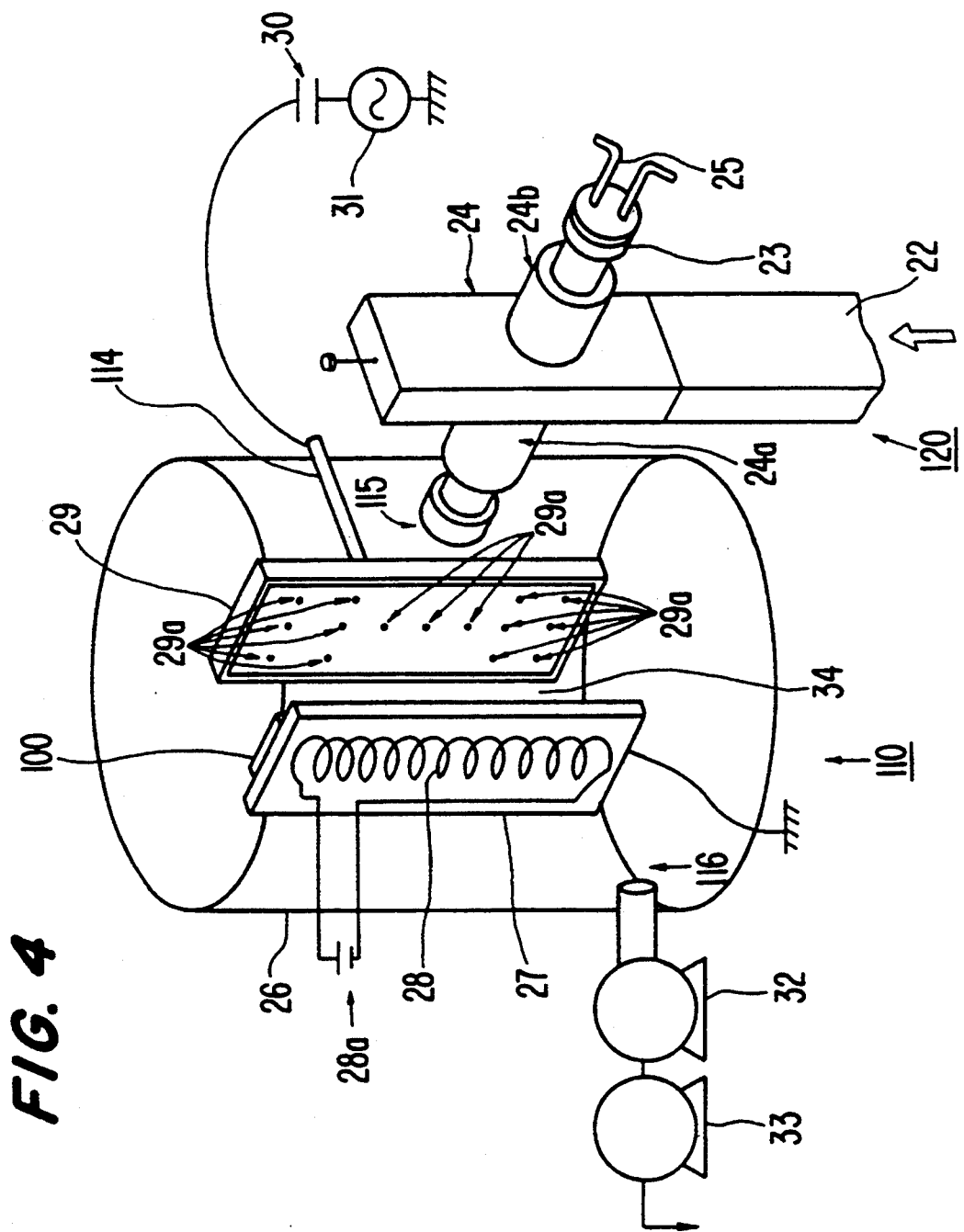
FIG. 4 is a perspective view of the thin film formation apparatus of FIG. 3.

Referring to FIGS. 3 and 4, a thin film formation apparatus, generally designated by reference numerals 110 includes a reactor vessel 26 having a first inlet port 114, a second inlet port 115 and an outlet port 116. Inlet port 114 is connected to one end of an inlet pipe 118, the other end of which is connected to suitable starting gas sources 1, 2 and 6. Outlet port 116 is connected to a suitable vacuum pump comprising a rotary pump 33 and a mechanical booster pump 32.

The inlet pipe 118 is connected to a gas source 1 containing disilane ($Si_2H_6$) through a flow regulator 5a, to a gas source 2 containing propane ($C_3H_6$) through a flow regulator 5b and to a gas source 6 containing diborane ($B_2H_6$) through a flow regulator 5e. The diborane ($B_2H_6$) is diluted with helium (He) so that it contains 100 ppm of He.

Inlet port 115 is connected to hydrogen radical generating means 120. Hydrogen radical generating means 120 includes a quartz pipe 23 having one end 23a that is connected to inlet port 115 and another end 23b that is connected to a gas source 7 to be described hereinbelow. Quartz pipe 23 has a diameter of 30 mm and hydrogen ($H_2$) is supplied thereto from a hydrogen gas inlet port 25 at end 23b of the quartz pipe 23 via a flow regulator 5f from gas source 7 containing hydrogen gas. Hydrogen radical generating means 120 also includes a microwave oscillator 21 for generating microwaves of 2.45 GHz, a waveguide 22 for guiding the microwaves to the quartz pipe 23 and a plasma generating furnace 24 for generating a hydrogen gas plasma in the hydrogen gas passing through pipe 23. Furnace 24 has cylindrical portions 24a and 24b covering the quartz pipe 23 so that the entire circumference and the total area in the longitudinal direction of the quartz pipe 23 is irradiated by microwaves guided by the waveguide 22.

The thin film formation apparatus 110 also comprises first and second electrodes 29 and 27 disposed in opposed relationship within the reactor vessel 26 to define a discharge zone therebetween; the first and second electrodes 29 and 27 being formed of a suitable conductive material such as stainless steel.

The first electrode 29 has openings 29a formed therein permitting the starting gas supplied through the inlet port 114 to flow into the reactor vessel 26. Openings 29a are provided in large numbers at the upper and lower sections of electrode 29 and in small numbers at the center area of electrode 29, as shown in FIG. 4, so that the starting gas supplied from the inlet port 114 is uniformly released along the length of the substrate 100.

The first electrode 29 is connected to a radio frequency electric source 31 through an impedance matching box (not shown) and a blocking capacitor 30; the RF source 31 (13.56 MHz) being grounded as shown in FIG. 3.

The second electrode 27 includes a rectangular flat portion 27a, is mounted on the bottom inner wall of the reactor vessel 26, and is grounded as shown in FIG. 3. A substrate 100 is placed on flat portion 27a at a predetermined location, and portion 27a is heated by a suitable electric heater 28 incorporated therein. Heater 28 is driven by a power source 28a.

Figure 1:
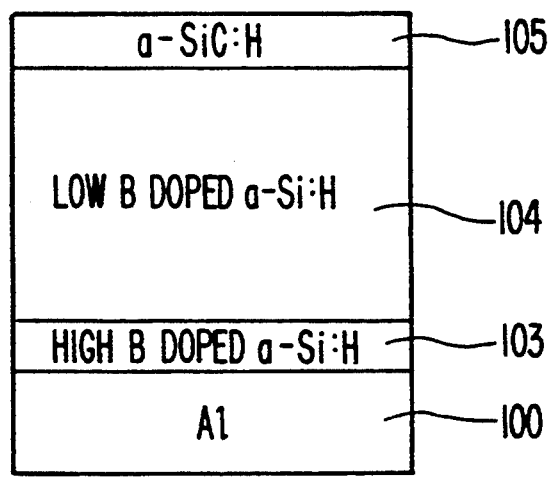
FIG. 1 is a schematic illustration of the make-up of a-Si photosensitive member.

A photosensitive member of the construction shown in FIG. 1 may be formed by the following method in the thin film formation apparatus shown in FIG. 3 and FIG. 4.

First, a substrate 100 of aluminum Al, etc. is placed under atmospheric conditions on second electrode 27 which is located in facing, opposed relationship with respect to first electrode 29 to form a deposition space 34 therebetween within the reactor vessel 26.

Next, air is drawn from the reactor vessel 26 through the outlet port 116 by the vacuum pumps 32, 33 until the pressure in the reactor vessel 26 is lower than 0.2 Torr. Then the substrate 100 is heated to a predetermined temperature (250° C.) by the electric heater 28 while a starting gas is continuously introduced into the reactor vessel 26 through the inlet port 114 and the opening holes 29a so that the pressure therein is maintained at a predetermined level (0.2 Torr). The vacuum pumps 32, 33 are continuously driven.

Thereafter, only the flow regulators 5a, 5b are actuated and therefore only disilane $Si_2H_6$ from the gas source 1 and diborane $B_2H_6$ from the gas source 6 are introduced to the reactor vessel 26 through the flow regulators 5a, 5e, pipe 118, inlet port 114 and opening holes 29a of first electrode 29. In this case, the flow rate of disilane $Si_2H_6$ is 30 SCCM (Standard Cubic Centimeter per Minute: Mass flow rate at 0° C., 1 atm) and the flow rate of diborane $B_2H_6$ is 42 SCCM.

Under this condition, a radio frequency (RF) power of 100W is applied to the first electrode 29 from the radio frequency source 31. As a result, the starting gas consisting of disilane $Si_2H_6$ and diborane $B_2H_6$ is decomposed in the deposition space 34 and is formed into a plasma. Thus, an a-Si:H film which is doped with boron (B) to a high degree is formed on the substrate 102 until it attains a thickness of 0.56 μm. This a-Si:H film is the blocking layer 103.

After formation of the blocking layer 103 on the substrate 102, the pressure in the reactor vessel 26 is reduced to about 0.1 Torr and maintained at such level. Simultaneously with such pressure reduction operation, flow regulator 5e is adjusted so that the flow rate of diborane $B_2H_6$ becomes 1 SCCM. RF power is 100W.

An a-Si:H film which is doped with boron (B) to a lesser degree is formed on the blocking layer 103 until it attains a thickness of about 3~4 μm. This a-Si:H film is the photosensitive member layer 104.

After formation of the photosensitive member 104, the film forming conditions of the thin film formation apparatus are changed as indicated below and a surface protecting layer 105 having a thickness of 0.18 μm is formed on the photosensitive member 104.

Pressure: 0.1 Torr
Substrate temperature: 250° C.
RF power: 100W
Flow rate of $Si_2H_6$: 2 SCCM
Flow rate of $C_3H_8$: 20 SCCM
Flow rate of $H_2$: 100 SCCM
Microwave power: 380W The flow regulator 5e is closed after formation of the photosensitive member 104 while the pressure is maintained at 0.1 Torr and the substrate temperature is maintained at 250° C. Thus, the flow rate of diborane ($B_2H_6$) becomes 0 SCCM.

Meanwhile, the flow rate of disilane $Si_2H_6$ from the gas source 1 is set at 2 SCCM by the flow regulator 5a, and the flow of propane $C_3H_8$ from the gas source 2 to is set at 20 SCCM by the flow regulator 5b. The disilane $Si_2H_6$ and propane $C_3H_8$ are introduced into the reactor vessel 26 as the starting gas through the inlet port 114. Simultaneously, hydrogen gas $H_2$ from the gas source 7 is also introduced into the reactor vessel 26 by flow regulator 5f through the hydrogen gas introducing pipe 25 and the inlet port 115. The flow rate of $H_2$ is set at 100 SCCM.

Under this condition, a radio frequency power of 100W is applied to the first electrode 29 from the radio frequency electric source 31 and simultaneously or immediately after such application, a microwave power of 380W is supplied to the microwave oscillator 21.

When a predetermined RF voltage is applied between the first and second electrodes 29 and 27 by the RF electric source 31 to cause an RF discharge therebetween, the electrons generated by the RF discharge collide with the starting gas molecules so that a plasma zone 34 is formed between the first and second electrodes 29 and 27. At the beginning of the RF discharge, the electrons, which are vibrated in the vicinity of the first electrode 29, are captured by the first electrode 29 due to the existence of the blocking capacitor 30, so that the potential of the first electrode 29 is self-biased toward the negative side.

The hydrogen gas in the quartz pipe 23 introduced through hydrogen gas introducing pipe 25 of quartz pipe 23 is sent past the waveguide 22 and becomes plasma and then hydrogen radicals (·H) 10 due to the microwave energy provided in the plasma generating furnace 24.

The hydrogen radicals (·H) 10 are guided to the plasma zone 34 in the reactor vessel 26.

Thus, a sufficient quantity of hydrogen radicals (·H) 10 is supplied between the first electrode 29 and second electrode 27 and an a-$Si_{1-x}C_x$:H film containing a large amount of carbon (x=0.8) is formed.

Therefore, when the thin film formation apparatus is operated as described above there is sufficient coupling of silicon (Si) with species which have lower coupling energies than carbon (C). Accordingly, the a-SiC:H film thus formed is dense and has less dangling Si atom bonds.

The a-Si photosensitive member prepared as described above has such good electrical characteristics that its charging voltage is 500V, its residual potential is 5V and its half-value exposure is 1.0 $\mu J/cm^2$.

Moreover, this a-Si:H photosensitive member does not cause blurring even when exposed to an ambient temperature of 35° C. and 85% RH and has excellent moisture proof characteristics.

The a-SiC:H film of the invention will be understood more readily by reference to the following additional examples; however, these examples are intended to illustrate the invention and are not to be construed to limit the scope of the invention.

Example 1:

After formation of the blocking layer 103 and photosensitive member 104 on the substrate 100 by the method described above using the thin film formation apparatus shown in FIG. 3 and FIG. 4, a surface protecting layer 105 is formed using the film forming conditions as indicated by Table 1.

TABLE 1

| No | Gas Flow Rate (SCCM) | | | Flow rate ratio r |
|---|---|---|---|---|
| | $Si_2H_6$ | $C_3H_8$ | $H_2$ | |
| C2-2 | 5 | 5 | 100 | 0.50 |
| C2-1 | 2.2 | 10 | 100 | 0.82 |
| C2-3 | 2.2 | 20 | 100 | 0.90 |

Common conditions:

Pressure: 0.2 Torr
RF power: 100W
Microwave power: 380W
Substrate temperature: 250° C.
r=$C_3H_8$/ ($C_3H_8$+$Si_2H_6$)

Table 2 indicates that electrical characteristics of the a-Si photosensitive member formed under the film forming conditions described above.

| No | Charging voltage (corotron voltage (KV)) | (V) | Charging capability (V/$\mu$m) | Residual voltage (V) | Dark attenuation time (S) | Content of carbon (x) |
|---|---|---|---|---|---|---|
| C2-2 | 125 | (+8.0) | 32.3 | 3 | 27 | 0.3 |
| C2-1 | 130 | (+9.5) | 32.7 | 8 | 30 | 0.45 |
| C2-3 | 190 | (+9.0) | 44.9 | 9 | 65 | 0.7 |

The a-Si:H photosensitive member of sample No. C2-3 does not generate blurring under atmospheric conditions of 35° C. and 80% RH. On the other hand, sample No. C2-2 generates blurring and sample No. C2-1 sometimes generates blurring.

Figure 2:
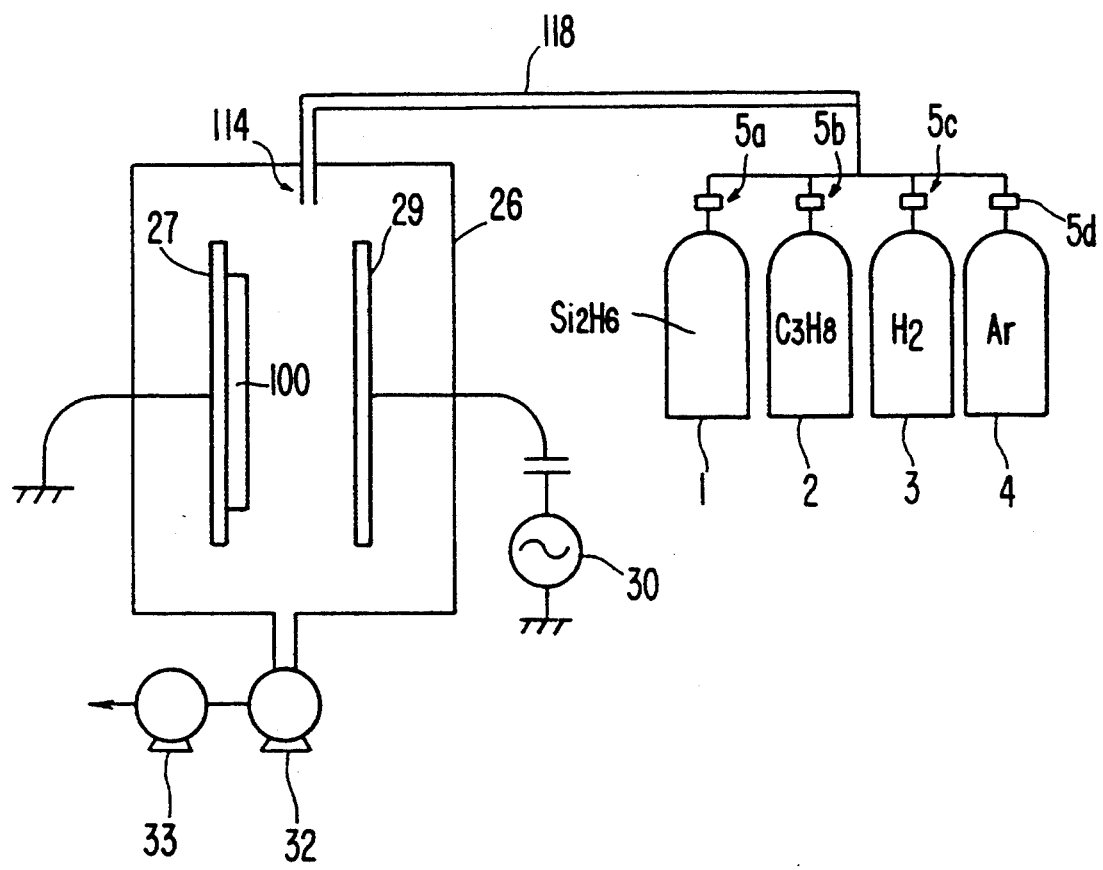
FIG. 2 is a schematic illustration of a prior art RF-CVD apparatus.

For purposes of comparison, an a-Si photosensitive member was also manufactured under the same film forming conditions as that for the sample No. C2-3 using the prior art RF-CVD apparatus shown in FIG. 2.

Such a-Si photosensitive member provides a maximum charging capability of only 20 V/$\mu$m.

Example 2:

Table 3 compares the physical characteristics of a-SiC:H films directly formed on the flat surface 100 by the film formation apparatus (HR-CVD) shown in FIG. 3 and FIG. 4 and the RF-CVD apparatus of the prior art shown in FIG. 2.

TABLE 3

| Film forming system (Sample No.) | HR-CVD (C1-8M) | RF-CVD (C1-9H1) |
|---|---|---|
| $E_{gopt}$ (eV) | 2.52 | 2.53 |
| B value ($cm^{-1/2}eV^{-1/2}$) | 600 | 400 |
| Contact angle (deg) | 84 | 70 |

Film forming conditions:
Pressure: 0.2 Torr
Substrate temperature: 250° C.
RF power: 100W
Flow rate of $Si_2H_6$: 2.2 SCCM
Flow rate of $C_3H_8$: 20 SCCM
Flow rate of $H_2$: 100 SCCM
Microwave power: 380W (HR-CVD only)
r: 0.9

The carbon contents of these samples can be considered to be almost equal from the value of $E_{gopt}$. The B value of the film manufactured by the HR-CVD apparatus is larger than that of the film manufactured by the RF-CVD apparatus and the contact angle thereof is also larger because the density of the film has been increased by the introduction of hydrogen radicals into the deposition space.

Example 3

Table 4 shows a comparison between a sample No. C1-3 manufactured by introducing propane $C_3H_8$ together with disilane $Si_2H_6$ into the reactor vessel 26 through the pipe 118 using the thin film formation apparatus shown in FIG. 3 and FIG. 4 and a sample No.

Figure 5A:
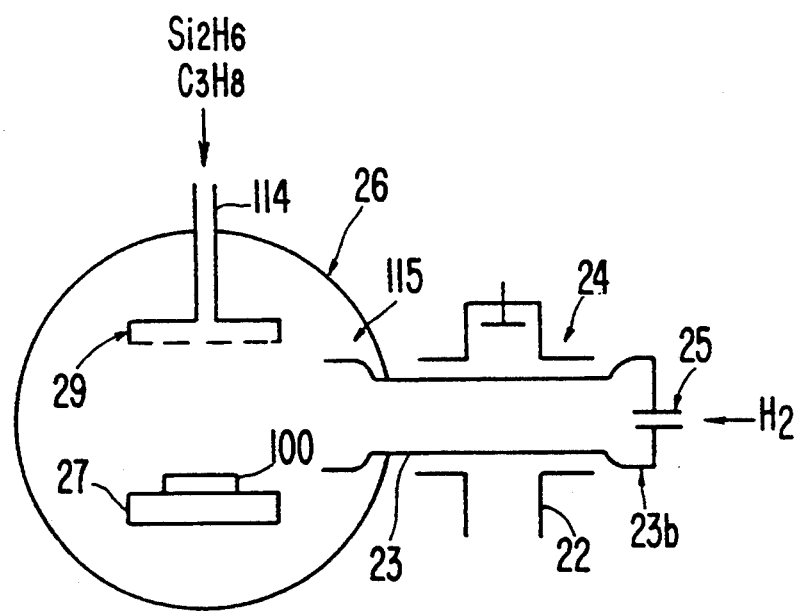
FIG. 5 is a schematic diagram to explain the method of introducing propane gas to the apparatus of FIG. 3.
Figure 5B:
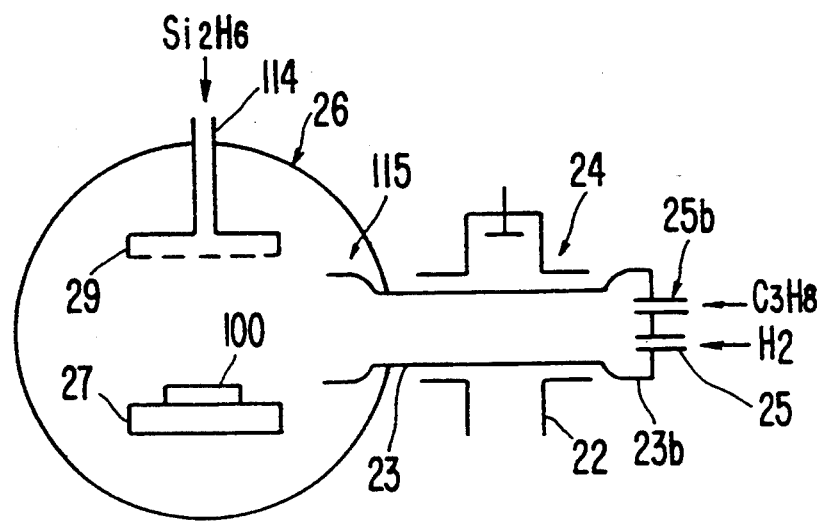

C1-4 manufactured by introducing propane $C_3H_8$ together with hydrogen $H_2$ into the end 23b of the quartz pipe 23 and thus into the reactor vessel 26. FIG. 5 is a schematic diagram explaining the methods for introducing propane $C_3H_8$. FIG. 5(a) shows the situation where disilane $Si_2H_6$ and propane $C_3H_8$ are supplied together through the pipe 118 and inlet port 114, while FIG. 5(b) shows the situation where propane $C_3H_8$ is supplied through a propane introducing pipe 25b connected to the end 23b of the quartz pipe 23.

TABLE 4

| Introducing system (Sample No.) | a (C1-3) | b (C1-4) |
| --- | --- | --- |
| $E_{gopt}$(eV) | 2.12 | 2.12 |
| B value ($cm^{-1/2} eV^{-1/2}$) | 715 | 699 |
| Contact angle (deg) | 73 | 59 |

This comparison suggests that the introducing system in FIG. 5(a) provides better results. In the introducing system within quartz pipe 23 and thus the amount of $CH_n$ and $C_2H_n$ shown in FIG. 5(b), $C_3H_8$ is decomposed to form carbon atoms (C) radicals is increased. In such case, the density of film is probably decreased because the amount of hydrogen available to form Si-H at the outermost surface of the a-SiC:H film formed on the substrate 100 in the deposition space 34 is diminished and therefore the number of dangling Si atom bonds increases.

Film forming conditions:
Pressure: 0.2 Torr
Substrate temperature: 250° C.
RF power: 100W
Flow rate of $Si_2H_6$: 3 SCCM
Flow rate of $C_3H_8$: 7 SCCM
Flow rate of $H_2$: 100 SCCM
Microwave power: 360W
r: 0.7

Example 4

Figure 6:
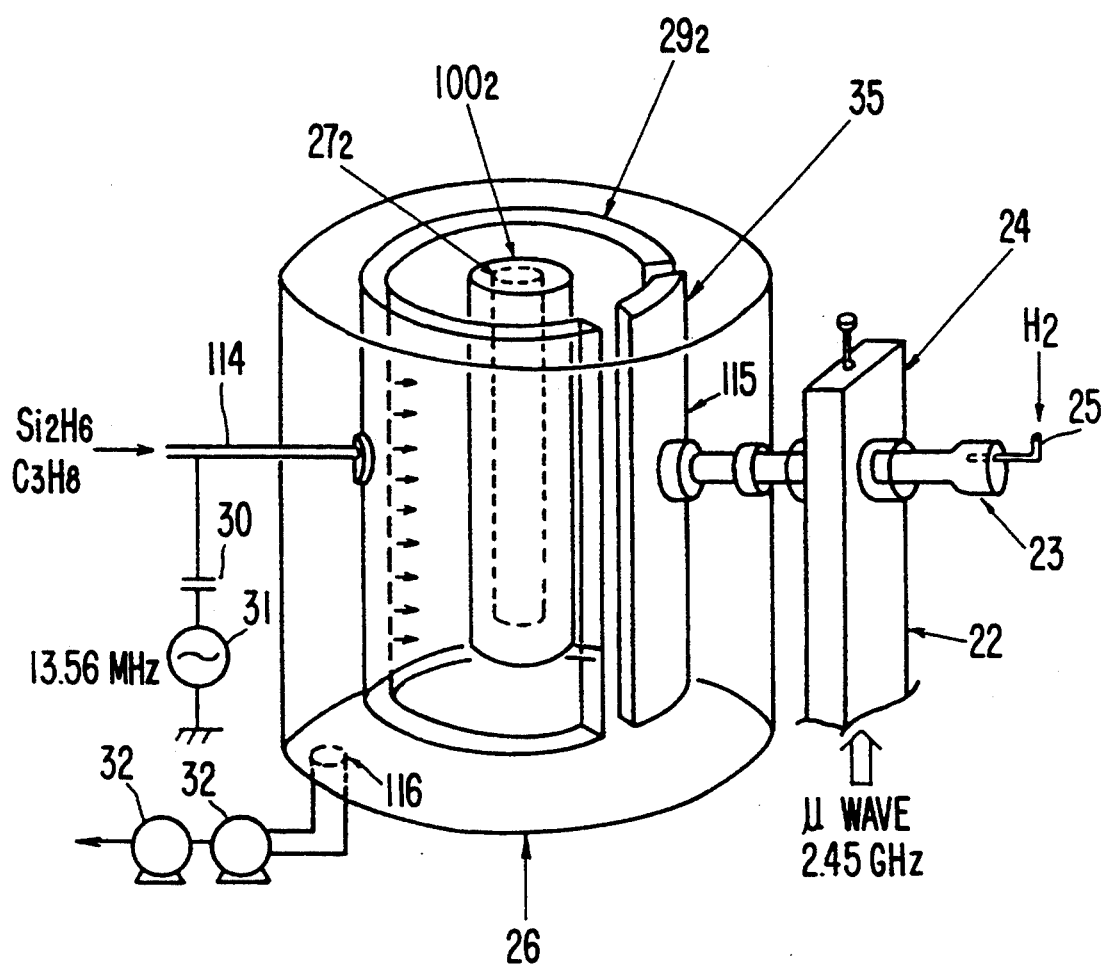
FIG. 6 is an alternative thin film formation apparatus used for generating photosensitive member drums.

FIG. 6 illustrates a thin film formation apparatus for manufacturing a photosensitive member drum. The second electrode 27 of the thin film formation apparatus (HR-CVD) of FIG. 3 and FIG. 4 is formed into a cylinder so that it can be rotated by a drive motor (not shown). The substrate 100Z also is in cylindrical form and the first electrode 29 is arcuate and extends around almost the entire circumference of the second electrode 27. A hydrogen radical introducing part 35 is provided to introduce hydrogen radicals supplied from the inlet port 115 and to distribute the same uniformly along the length of the substrate 100. This hydrogen radical introducing part 35 is formed in the same shape as the first electrode 29 shown in FIG. 4.

An a-SiC:H film is formed using the following film forming conditions in the thin film formation apparatus of FIG. 6. The a-SiC:H film is formed by first depositing a blocking layer 103 and a photosensitive layer 104 on the cylindrical substrate 100Z. The blocking layer 103 and photosensitive layer 104 are deposited using the same method and conditions described previously. The blocking layer 105 is then deposited as described below.

Film forming conditions:
Pressure: 0.2 Torr
Substrate temperature: 250° C.
RF power: 100W
Flow rate of $Si_2H_6$: 2.2 SCCM
Flow rate of $C_3H_8$: 10 SCCM
Flow rate of $H_2$: 200 SCCM
Microwave power: 540W
r: 0.8

Table 5 shows the characteristics of the a-Si photosensitive member thus formed.

TABLE 5

| | |
| --- | --- |
| Charging voltage (V) | 360 (for a current of 120 μA flowing into the drum) |
| Residual voltage (V) | 5 |
| Charging capability (V/μm) | 6.7 |
| Contact angle (deg) | 80 to 85 |
| Moisture proof characteristics | No blurring under atmospheric conditions of 35° C. and 80% RH |
| Content of carbon (x) | 0.45 |

This a-Si photosensitive member drum shows high water repellent characteristics and a contact angle in the range of 80°~85°, although it differs slightly depending on position. This a-Si photosensitive drum assures good printing results without "blurring" under atmospheric conditions of 35° C. and RH even after continuous corona irradiation for two hours and then leaving the drum in the humid atmosphere overnight.

Example 5

The a-SiC:H films are formed directly on A1 substrates under the same film forming conditions for the purpose of investigating an a-SiC:H film (hereinafter referred to as a-SiC:H ①) formed using the thin film formation apparatus (HR-CVD) shown in FIG. 3 and FIG. 4 and an a-SiC:H film (hereinafter referred to as a-SiC:H ②) formed using the RF-CVD apparatus of the prior art.

Film forming conditions:
Pressure: 0.2 Torr
Substrate temperature: 250° C.
RF power: 100W
Flow rate of $Si_2H_6$: 2.0 SCCM
Flow rate of $C_3H_8$: 10 SCCM
Flow rate of $H_2$: 200 SCCM
Microwave power: 500W (HR-CVD only)

Table 6 shows the characteristics of the a-SiC:H films manufactured as described.

TABLE 6

| | a-SiC:H ① | a-SiC:H ② |
| --- | --- | --- |
| $E_{gopt}$(eV) | 2.21 | 2.14 |
| B value ($0cm^{-1/2}eV^{-1/2}$) | 674 | 641 |
| Contact angle (deg) | 79 | 72 |
| Content of carbon (x) | 0.45 | 0.45 |

To further investigate the differences between these two kinds of a-SiC:H films, they were subjected to corona irradiation for 60 minutes using a corona charger under atmospheric conditions of 35° C. and 80% RH and the surface conditions were measured by the high sensitivity reflection method (IR-RAS) using a Fourier's transformation infrared spectroscopic analyzer (FT-IR) (JIR-3505 manufactured by JEC).

Figure 7:
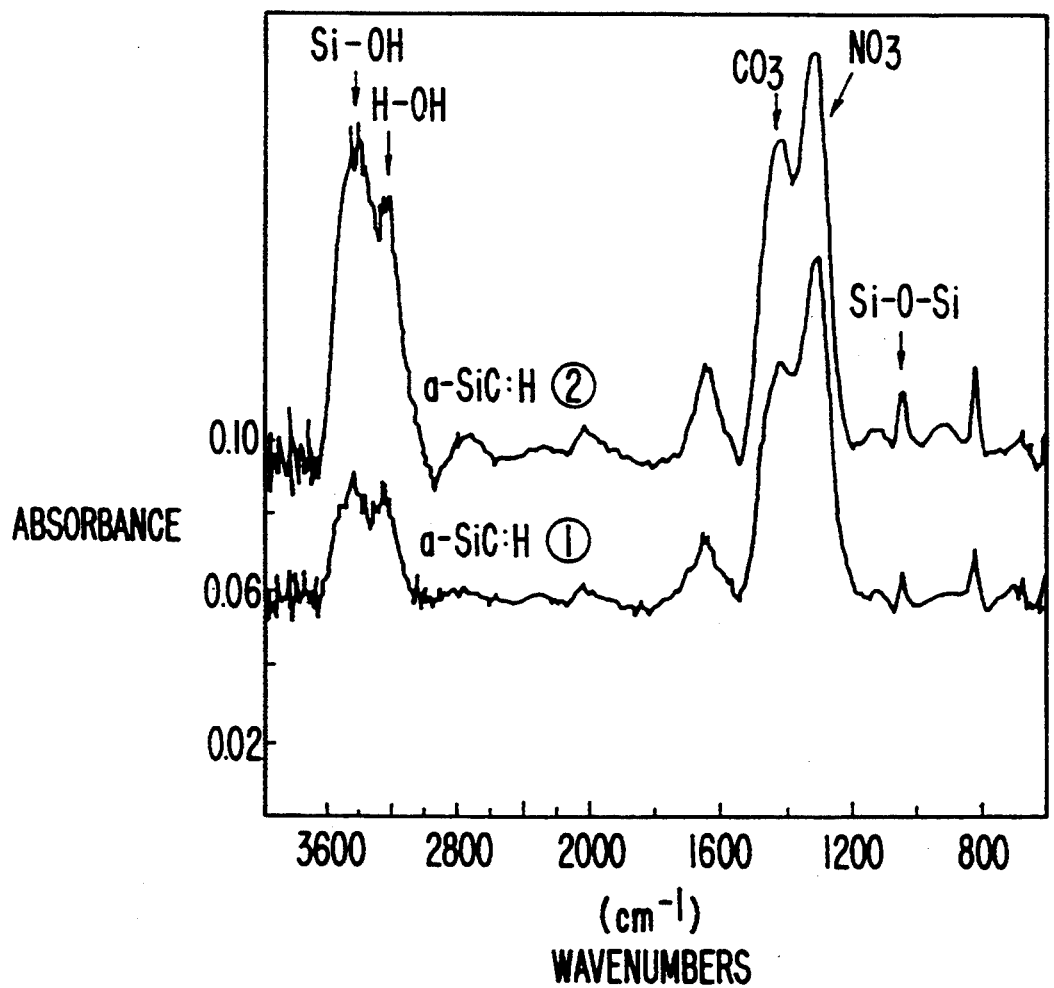
FIG. 7 is a graph showing the results of IR-RAS measurements.

FIG. 7 is a graph showing the results of the measurements by IR-RAS. Compared with the a-SiC:H ② film, the a-SiC:H ① film exhibits about ⅓ as much absorption of H-OH and oxidation of Si to form Si-O-Si, Si-OH, etc.

Laser Raman spectroscopic measurement was also used for investigating the differences of the constitutions of such a-SiC:H films.

Figure 8:
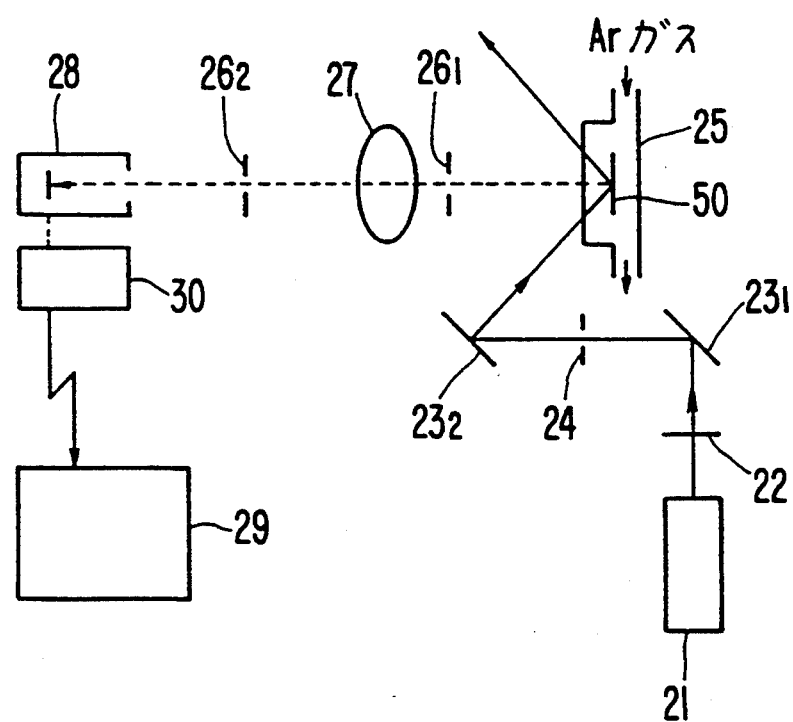
FIG. 8 is a schematic diagram to explain the laser Raman spectroscopy measuring apparatus.

FIG. 8 is a schematic diagram to illustrate the Laser Raman spectroscopy measurement procedure as used for measuring the density of an a-SiC:H film. The laser oscillated from the $Ar^+$ 488 nm oscillator 21 for excitation laser oscillation passes an interference filter 22 and enters a sample cell 25 to which Ar gas is supplied with an incident angle of 45° by way of a mirror $23_1$, a slit 24 and a mirror $23_2$. Sample 50 is a film deposited on a substrate 100. The Raman scattering beam emitted from the sample 50 is sent to a spectrometer 28 by way of a slit $26_1$, a condenser lens 27 and a slit $26_2$ and is converted to the spectrum in a data processing unit 29. 30 designates a photomultiplier.

For the measurement of a-SiC:H films, a laser Raman spectrometer manufactured by JEC has been used.

The spectrum result obtained by such measurement of an a-SiC:H film exhibits both a TO peak (about 488 $cm^{-1}$) and a TA peak (about 150 $cm^{-1}$). The TO/TA peak ratio provides an indication of disturbances in the symmetry of Si coupling or constitution of the film and larger values of such ratio suggest a higher density of constitution.

Figure 9:
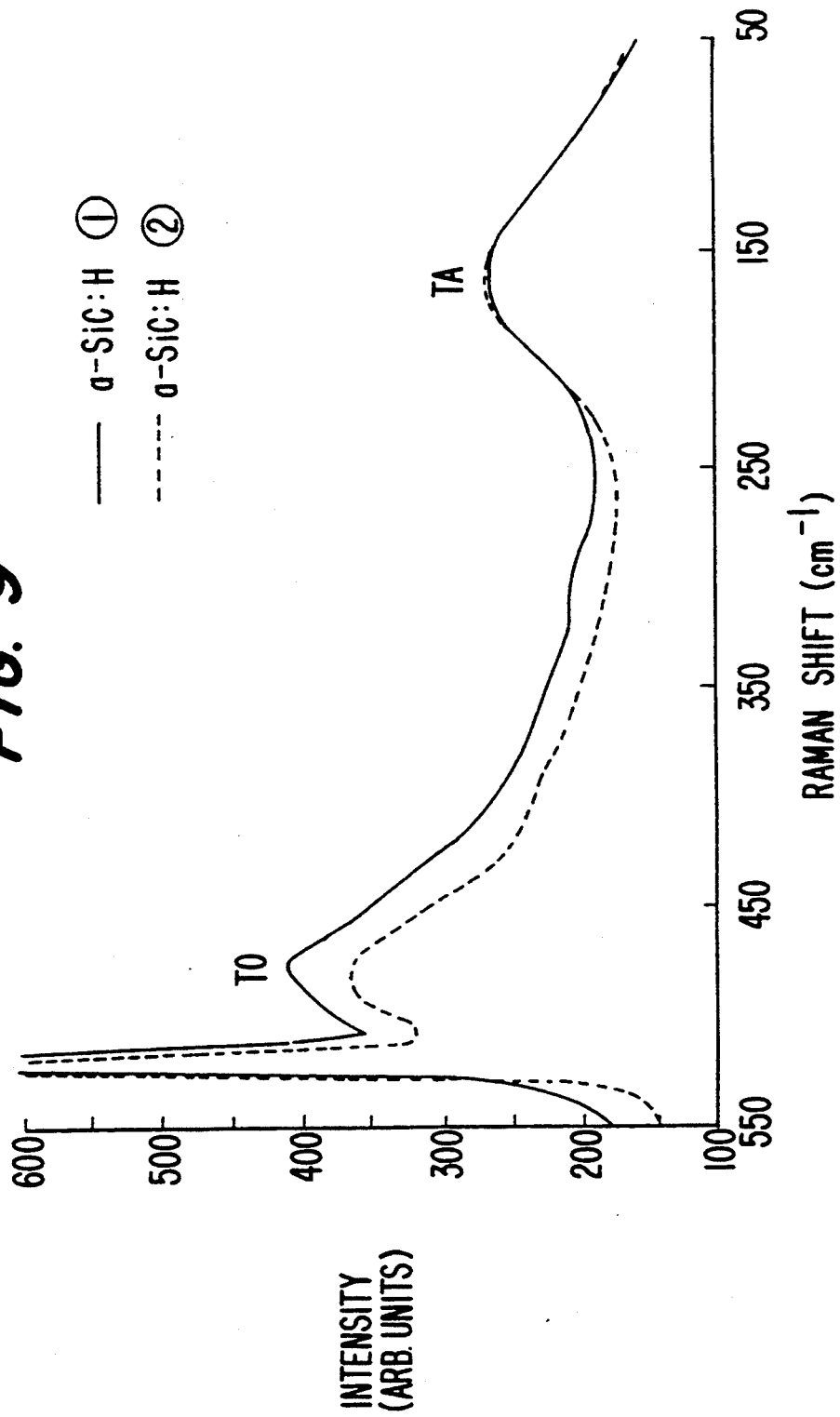
FIG. 9 is a graph showing laser Raman spectroscopy measurement results.

FIG. 9 shows the results of laser Raman spectroscopy measurements and compares a high density a-SiC:H① film with a conventional a-SiC:H② film. The TO/TA ratio of a-SiC:H② is 1.8 and that of a-SiC:H① is 2.4, thus proving that the latter has a denser constitution. This effect is believed to be the result of phenomena explained hereinbelow.

When carbon is contained in a-Si:H, the Si network is disturbed to a certain degree. As a result, the reactivity of Si at the surface of an a-SiC:H film increases, and the surface Si is oxidized by ozone ($O_3$) generated by corona irradiation and is easily changed to Si-O-Si and Si-OH. However, it is believed that the reactivity of surface Si is suppressed in high density a-SiC:H films and moreover, that surface absorption and oxidation by corona irradiation under conditions of high humidity can be eliminated, thus preventing blurring.

In order to investigate the relationship between the carbon content (x) of a-SiC:H films and the TO/TA ratio thereof, a-SiC:H films of different carbon content (x) have been manufactured by varying the flow rates of disilane $Si_2H_6$, propane $C_3H_8$ and hydrogen $H_2$.

Table 7 shows relationships among flow rate, carbon content (x) and contact angle.

TABLE 7

| No. | Flow Rates (SCCM) | | | Content of carbon (x) | Contact angle (deg) | |
|---|---|---|---|---|---|---|
| | $Si_2H_6$ | $C_3H_8$ | $H_2$ | | a-SiC:H ① | a-SiC:H ② |
| 1 | 5 | 5 | 200 | 0.3 | 70 | 60 |
| 2 | 2.2 | 10 | 200 | 0.45 | 80 | 77 |
| 3 | 2.4 | 10 | 200 | 0.6 | 81 | 80 |
| 4 | 2.2 | 20 | 200 | 0.7 | 82 | 80 |

Figure 10:
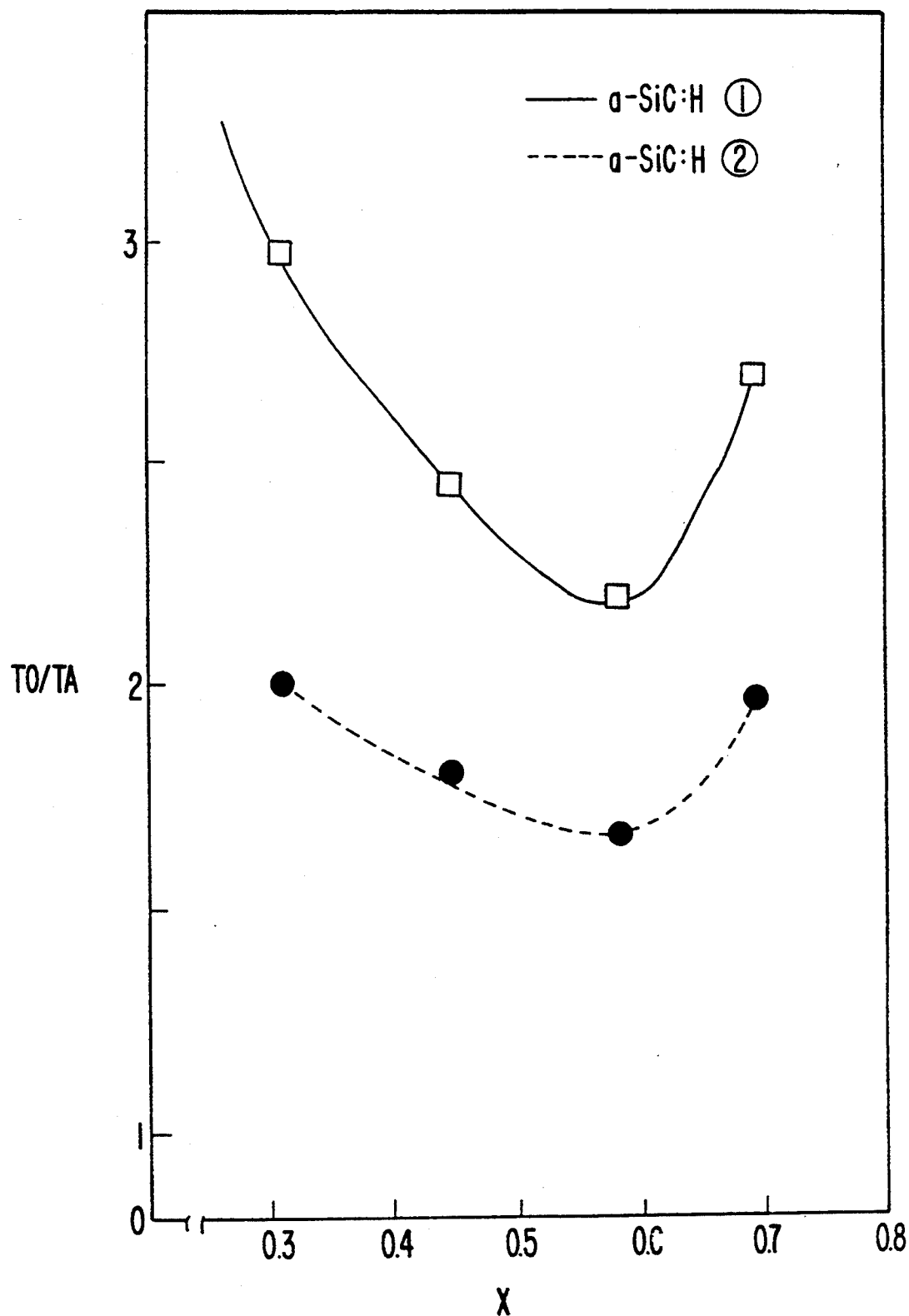
FIG. 10 is a graph showing the relationship between carbon content and TO/TA ratio.

FIG. 10 is a graph showing the relationship between carbon content (x) and TO/TA ratio. As will be understood from FIG. 10, the a-SiC:H① film has a TO/TA ratio of 2.0 or higher and has a film density that is higher than that of the a-SiC:H② film.

As a result of image formation tests under an atmosphere of 35° C. and 80% RH using an a-Si photosensitive member having an a-SiC:H ① film as the surface protecting layer, it was determined that an a-Si photosensitive member having the surface protecting layer with a carbon content of 0.3 generated blurring, but when the other protecting layers were used with the a-Si photosensitive member blurring did not occur.

When the carbon content x of a-$Si_{1-x}C_x$:H film is set at $x \geq 0.8$, carbon-rich constitution is obtained, lowering insulation characteristics and charging capability.

Therefore, the optimum hydrogenated amorphous silicon carbide expressed by the general formula a-$Si_{1-x}C_x$:H should have TO/TA ratio of 2.0 or more, wherein TO is the peak amplitude that appears in the vicinity of 480 $cm^{-1}$ and TA is the peak amplitude that appears in the vicinity of 150 $cm^{-1}$ as observed by laser Raman spectroscopy measurement using the excitation laser of $Ar^+$ 488 nm, and a carbon content (x) in the range of $0.4 \leq x \leq 0.8$.

Measurement values in Example 1 to 5 were determined using the measuring methods described below.

(1) Contact angle:

20 μl of pure water was dropped on a horizontal sample using a microcylinder (type 4780, manufactured by Eppendorno) and pictures of the drops were taken by a camera (RZ67, manufactured by Mamiya) straight from the side and the formula $2(h/d) = \tan\theta$ was used to calculate the angle from the width d of the drops and the height h from which they were dropped.

(2) Measurement of $E_{gopt}$:

Absorption at the wavelength of 200~800 nm of an a-SiC:H film deposited on the substrate is measured using an ultraviolet visible spectrophotometer (UV-3400, manufactured by Hitachi). The optical band gap ($E_{gopt}$) and value of B are obtained using the formula (1) below. The value of B indicates the gradient of the tail portion of the band as a criterion of film density.

$$\alpha(\omega) = B (h\omega - E_{gopt})^2 / h\omega \qquad (1)$$

Here, $\alpha(\omega)$; absorption coefficient,
$\omega$; number of variations
h; Planck's constant (3) Charging voltage:

This value is obtained using a paper analyzer (Model SP-428, manufactured by Kawaguchi Electric).

(4) Residual potential:

A sample charged by the Model SP-428 paper analyzer identified above was irradiated with a light beam having a wavelength of 675 nm and an intensity of $0.476 \times 10^2$ mW/m² and the potential for minimum charging is defined as the residual potential Vr.

(5) Dark attenuation time:

The time until the charging voltage is reduced to one half after a sample is charged using the Model SP-428 analyzer is defined as the dark attenuation time $t_{1/2}$.

Figure 11:
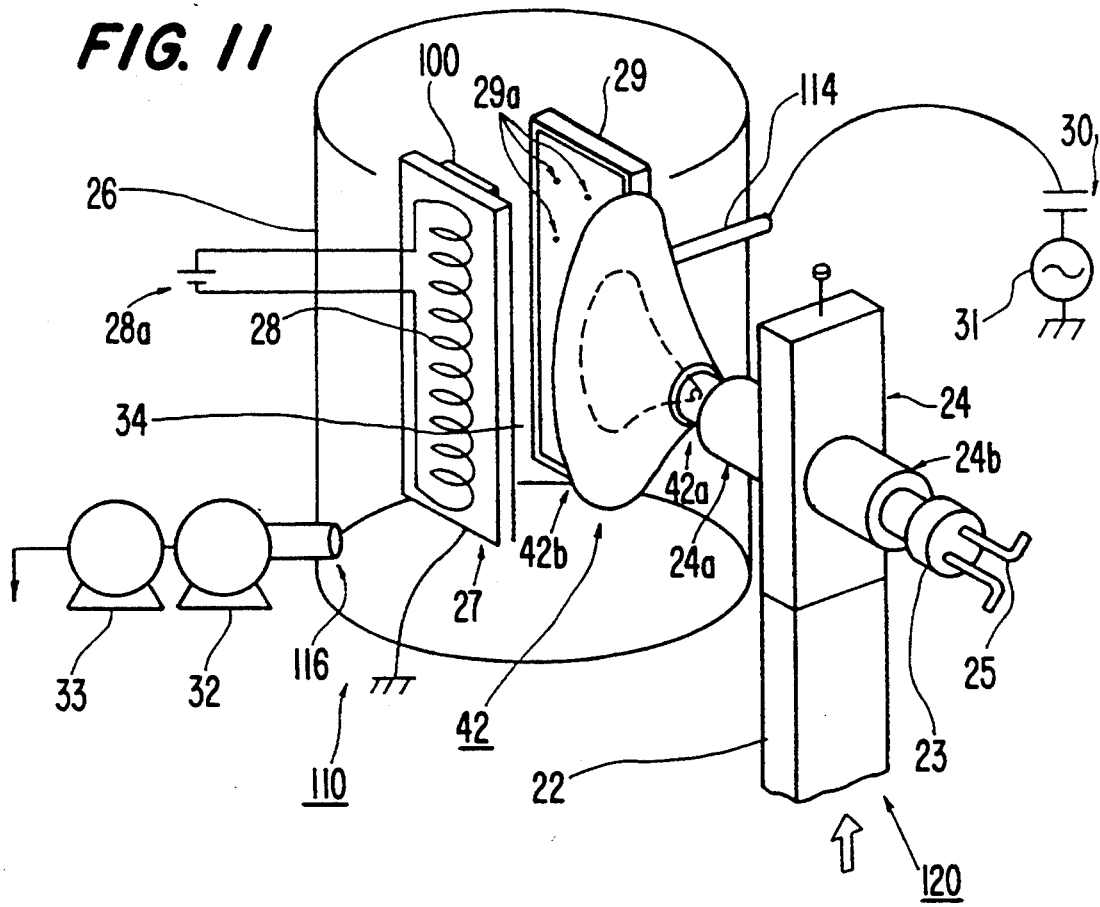
FIG. 11 is a schematic perspective view illustrating another embodiment of the present invention.

FIG. 11 is a schematic diagram illustrating a second embodiment of a thin film formation apparatus of the invention. In the embodiment shown in FIG. 11, a thin film formation apparatus provides a hydrogen radical introducing unit 42, which introduces the hydrogen radicals (·H) generated by the hydrogen radical generating unit 120 uniformly along the length of substrate 100 placed on the second electrode 27 in the reactor vessel 26, and is located between the reactor vessel 26 and hydrogen radical generating unit 120 for FIG. 3 and FIG. 4.

Figure 12:
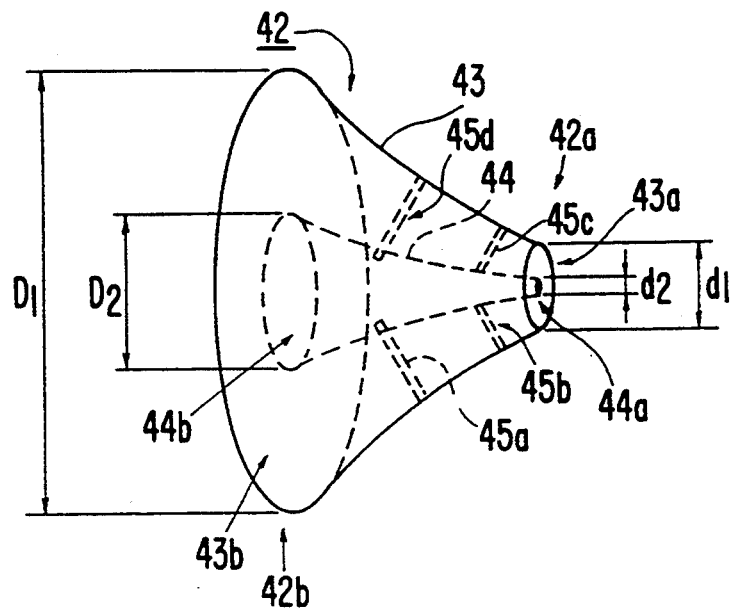
FIG. 12 is a schematic diagram illustrating a hydrogen radical inlet port for the embodiment of FIG. 11.

As shown in FIG. 12, hydrogen radical introducing unit 42 includes an outer wall 43 and an inner wall 44 which are concentrically arranged and shaped so as to increase the width of the unit 42 as it approaches electrode 27. The walls are coupled together with holding rods 45a, 45b, 45c and 45d. An end part 42a of the hydrogen radical producing unit 42 is connected with the output port of hydrogen radical generating unit 120 at the end of quartz pipe 23. The entire hydrogen radical introducing unit 42 is arranged within vacuum vessel 26, while the open end 42b of the hydrogen radical introducing unit 42 is provided in facing relationship to the deposition space 34.

The hydrogen radicals generated in the plasma generating furnace 24 during film formation are spread uniformly in the deposition space 34 by the outer wall 43 and inner wall 44 of the hydrogen radical introducing unit 42. In this case, the distribution of the radicals can be adjusted by adjusting the opening diameter $d_1$ of end part 43a of outer wall 43, the opening diameter $d_2$ of the end part 44a of inner wall 44, the opening diameter $D_1$ of end part 43d of outer wall 43 and/or the opening diameter $D_2$ of end part 44d of inner wall 44.

As described, the supply of hydrogen radicals to the deposition space 34 is conducted uniformly, and accordingly uniformity of film quality of the hydrogenated amorphous silicon carbide a-SiC:H film formed on the substrate 100 can be realized.

Figure 13:
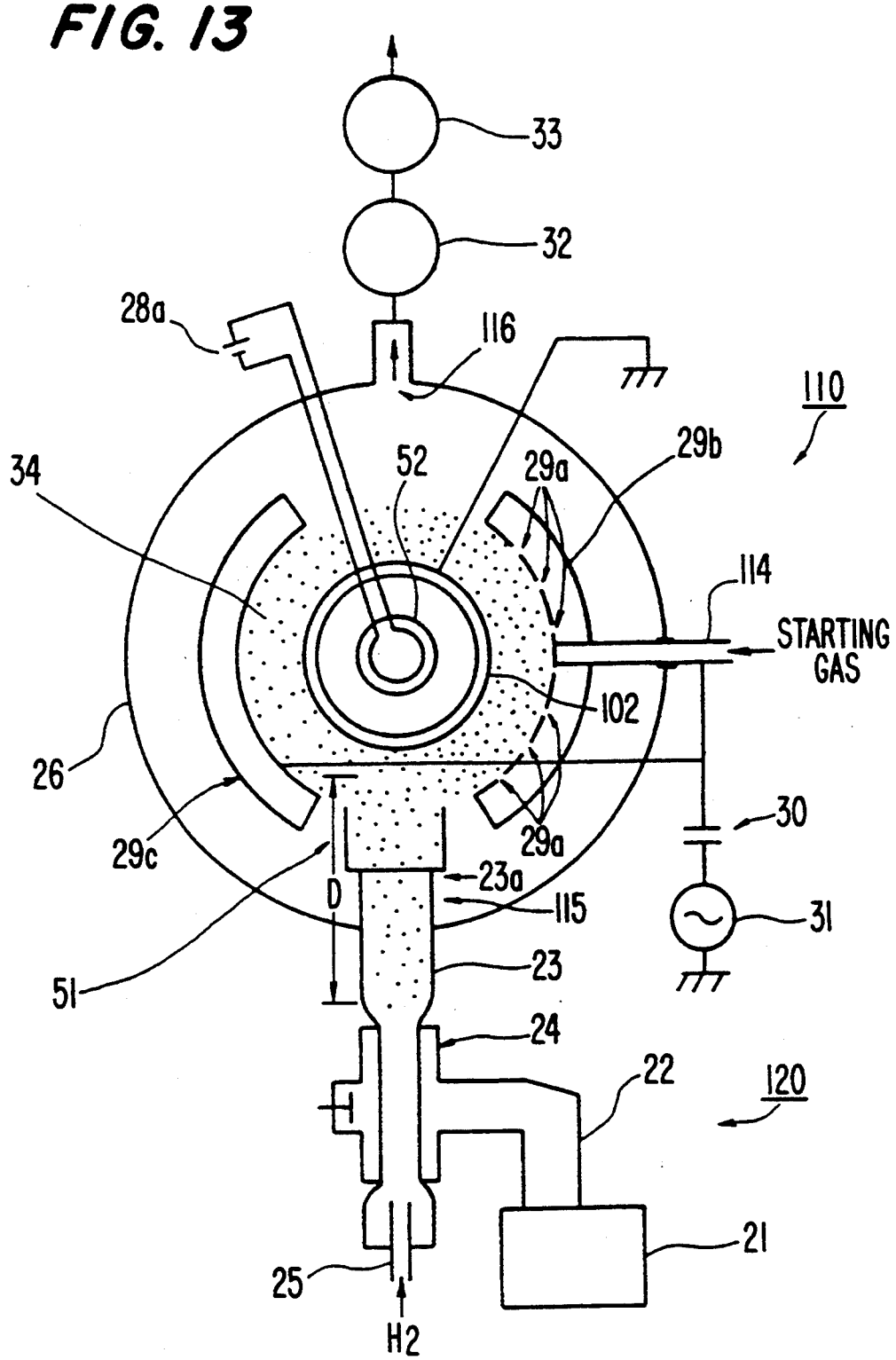
FIG. 13 is a schematic view illustrating a further embodiment of the invention.

FIG. 13 is a schematic diagram of a third embodiment of the invention. This embodiment illustrates an application of the apparatus of FIG. 12 for a drum type substrate.

In this embodiment, the first electrode is formed from a pair of divided electrodes 29b, 29c, each of which is connected with an RF source 31. Moreover, heater 52 is in a cylindrical form. The substrate 102 is in the form of an aluminum tube having a diameter of 80 mm and a length of 260 mm for carrying the a-Si photosensitive drum.

Figure 14:
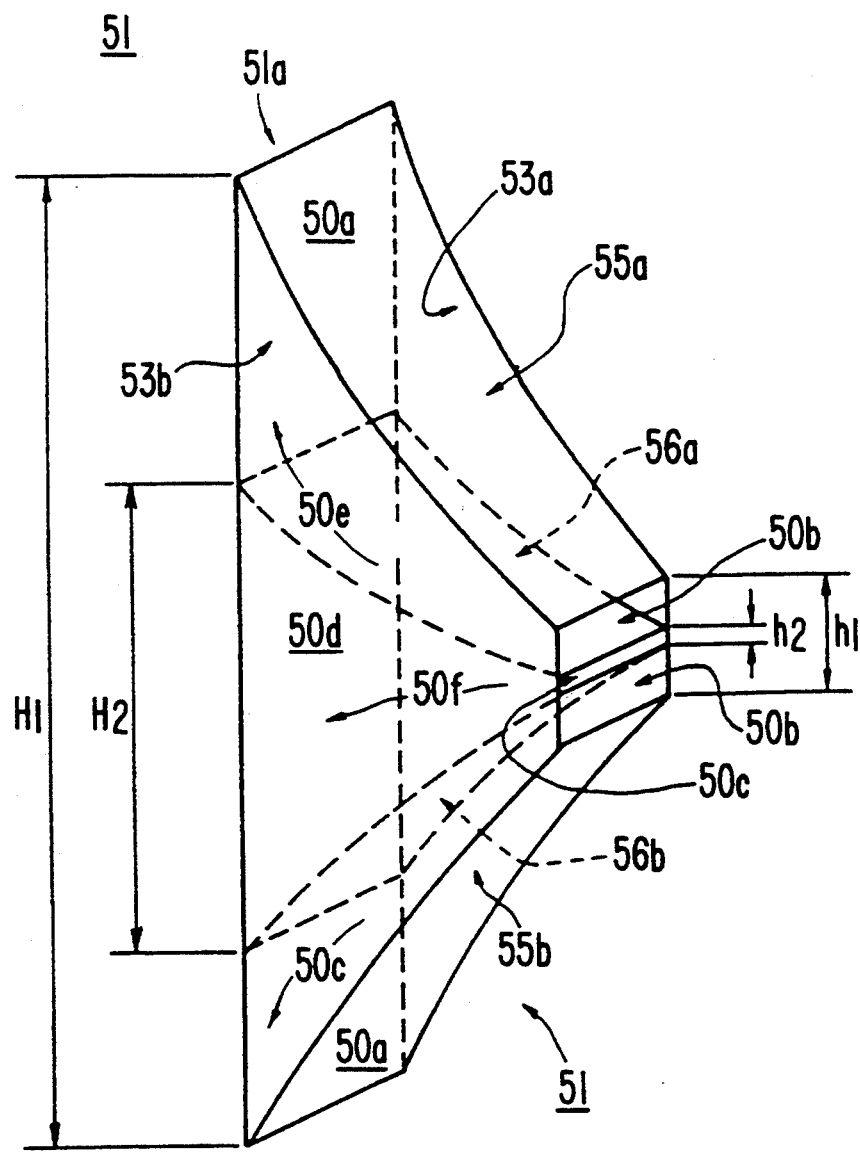
FIG. 14 is a schematic diagram illustrating a hydrogen radical inlet port for the FIG. 13 apparatus.

As shown in FIG. 14, the hydrogen radical introducing unit 51 is formed by joining outer walls 55a, 55b and inner walls 56a, 56b with side plates 53a, 53b to provide flow channels 50e, 50f which are rectangular in cross-sectional configuration and expand in width in a direction toward the depositing zone 54. The hydrogen radical introducing unit 51 is connected to the end part 23a of the quartz pipe 23 which is provided with a rectangular cross-sectional configuration and is positioned to face toward the deposition space 54 within the vacuum vessel 26. The hydrogen radicals are supplied from the openings 50a, 50d at the end 51a of hydrogen radical introducing unit 51 to the deposition space 54 through the channels 50e formed between outer wall 55a and inner wall 56a, and between outer wall 55b and inner wall 56b and the channel 50f formed between inner wall 56a and 56b. The radicals are received in channels 50e through openings 50b and in channel 50f through opening 50c.

For film formation, the starting gas ($Si_2H_6$ 2 SCCM and $C_3H_8$ 10 SCCM) is introduced to the reactor vessel 26 through openings 29a in the first electrode 29b from the inlet port 114, and hydrogen ($H_2$ 200 SCCM) is introduced from the hydrogen gas introducing unit 25. An a-SiC:H film is formed under the conditions that the temperature of substrate 102 is 250° C., the pressure in the reactor vessel 26 is 0.2 Torr, the RF power is 100W and the microwave power is 540W.

Table 8 shows the differences in the film at the center and the end portions of the cylindrical substrate 102 depending on whether or not the hydrogen radical introducing unit 51 is used.

TABLE 8

| | End part Center | Hydrogen radical introducing unit 51 | |
|---|---|---|---|
| | | Operating | Not operating |
| Uniformity of film forming rate | Center<br>End Part | 0.46 μm/h<br>0.46 | 0.46 μm/h<br>0.44 |
| Uniformity of optical band gap $E_{gopt}$ | Center<br>End Part | 2.21 eV<br>2.21 | 2.21 eV<br>2.12 |
| Uniformity of B value | Center<br>End Part | 674cm$^{-1/2}$.eV$^{-1/2}$<br>670 | 674cm$^{-1/2}$.eV$^{-1/2}$<br>570 |

Figure 15:
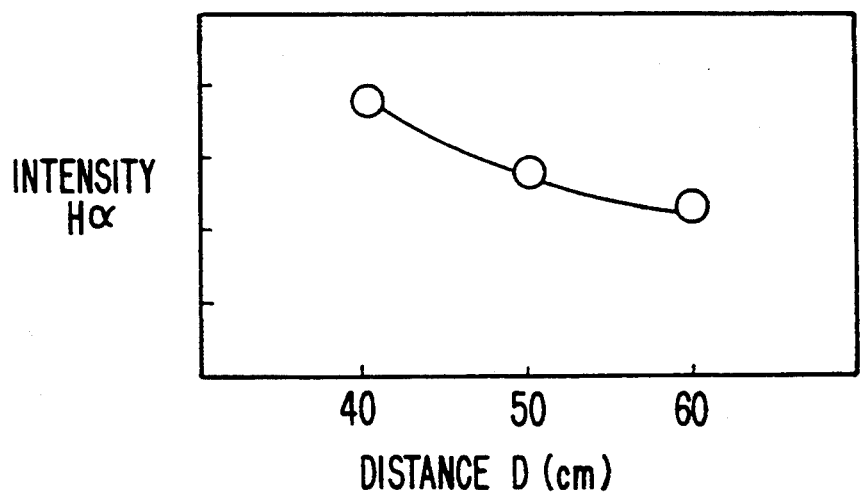
FIG. 15 is a graph plotting light emission intensity H against the distance D between the plasma generating furnace and a substrate.

The hydrogen radicals 10 have natural life times, and when the distance D between the deposition space 34 and the hydrogen radical generating area in furnace 24 becomes greater, the quantity of hydrogen radicals reaching the deposition space 34 becomes reduced. Thus, as shown in FIG. 15, when the distance D becomes greater, the intensity of emitted light is lower and the concentration of hydrogen radicals is also correspondingly lower.

In the system of FIG. 13, a large scale apparatus including a waveguide 22, a plasma generating furnace 24 and a quartz pipe 23 is used for generating hydrogen radicals and accordingly there is a limit to the extent that the distance D can be reduced.

The optical band gap $E_{gopt}$ and the B value relating to film density are very important considerations for determining the quality of a-SiC:H films, and uniformity in film quality and in film forming rates can be achieved by using the hydrogen radical introducing unit 51. By experimentation it has been determined that the ratio $h_2/h_1$ in FIG. 14 may be varied from 0.1 to 0.5 and that the ratio $H_2/H_1$ may be varied from 0.3 to 0.7. But, optimum results and the results of Table 8 are obtained when $h_2/h_1 = 0.2$ and $H_2/H_1 = 0.5$.

The hydrogen radical introducing unit 51 shown in FIG. 4 can also be used to form a film on a flat substrate 100 in the same way as in the second embodiment shown in FIG. 11.

As an alternative system, microwaves may be supplied directly to the reactor vessel to thereby decompose both the starting gas and the hydrogen gas in the vicinity of the substrate; however, such system includes the probability of a deterioration of film quality because the starting gas is decomposed by the microwaves and the film deposited on the substrate is also exposed to microwaves.

Figure 16:
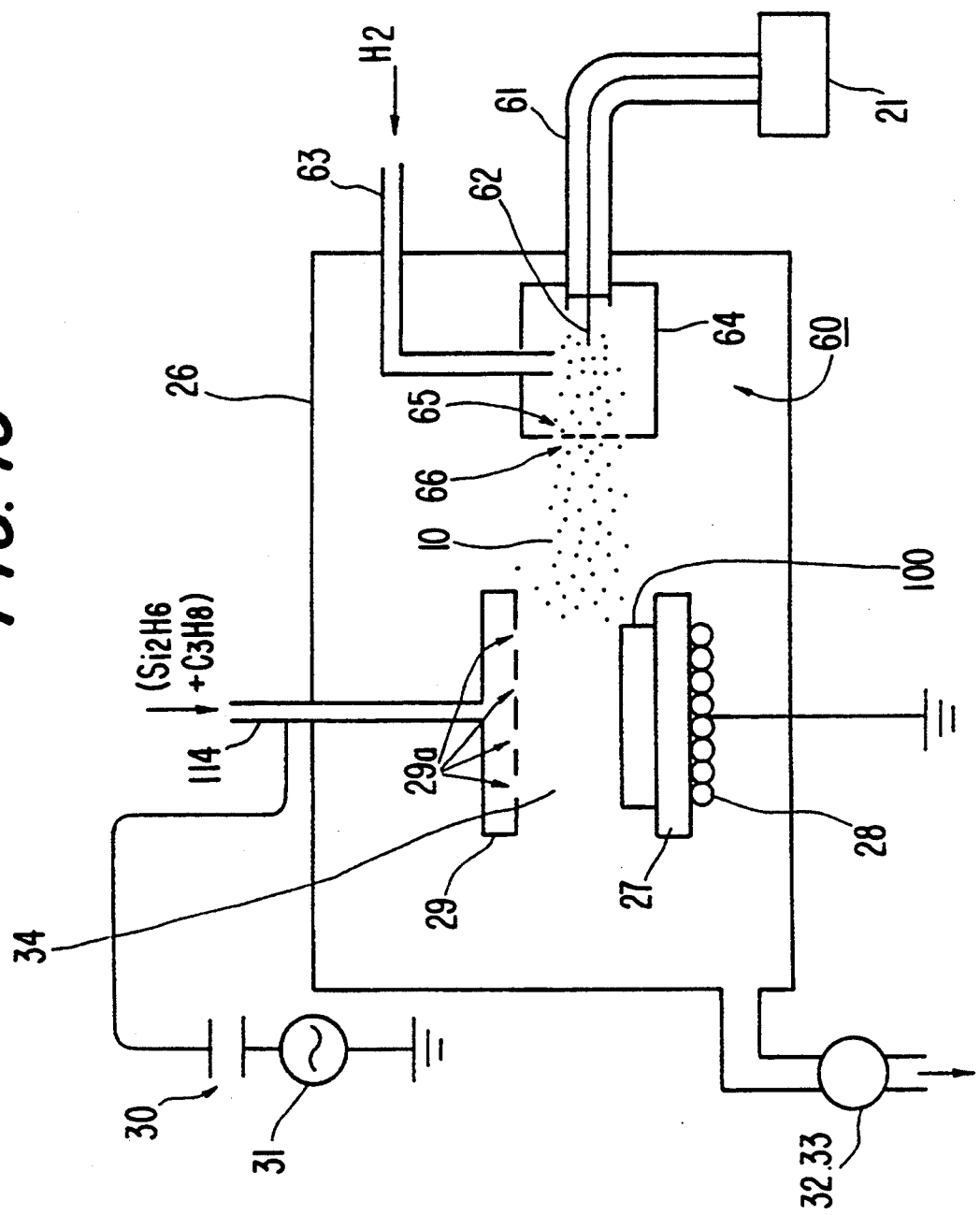
FIG. 16 is a schematic diagram illustrating yet another embodiment of the apparatus of the invention.

FIG. 16 shows another embodiment of a thin film formation apparatus which is capable of effectively forming a high quality film.

In the embodiment of FIG. 16, hydrogen radicals (·H) 10 are generated in the reactor vessel 26. In this regard, the hydrogen radical generator 60 comprises an antenna 62 connected to the microwave oscillator 21 through a coaxial cable 61, a box type vessel 64 to which the hydrogen gas from the source 4 (not shown) is introduced through the hydrogen gas introducing pipe 63 and a shielding member 66 which shields the microwaves released to the box type vessel 64 so that the microwave energy cannot move toward the substrate 100 through the hydrogen radical blowing port 65 of the box type vessel 64.

Figure 17:
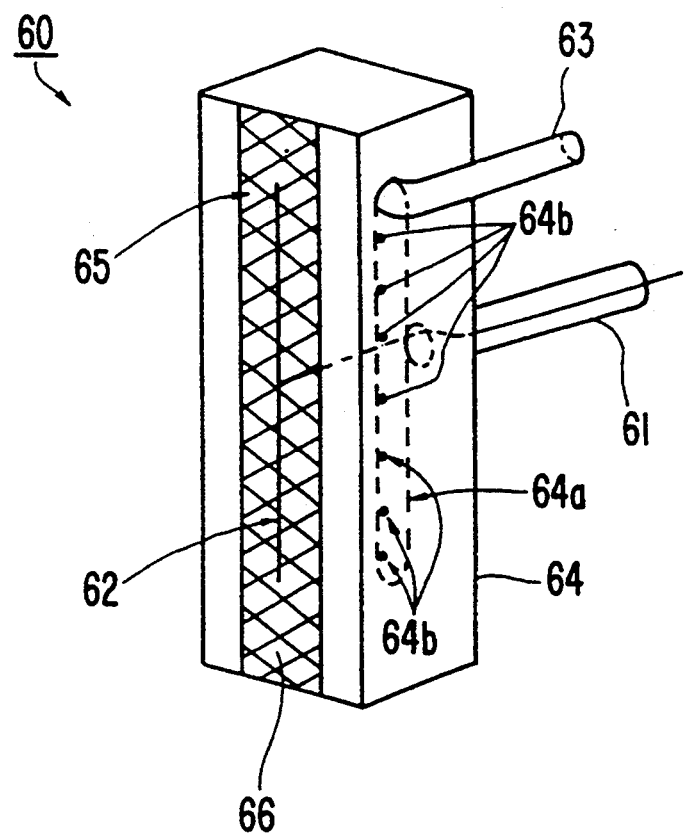
FIG. 17 is a schematic diagram illustrating a hydrogen radical generator for the apparatus of FIG. 16.

The hydrogen radical generator 60 comprises, as shown in detail in FIG. 17, a box type vessel 64 having a blowing port 65, an antenna 62 and a shielding member 66. The vessel 64 has the dimensions of 30 cm (height), 3 cm (width) and 5 cm (depth). The gas introducing pipe 63 is connected to the upper part of the vessel 64 to supply the hydrogen gas to the gas introducing path chamber 64a formed to extend longitudinally of the height of the vessel 64. The hydrogen gas thus supplied is then introduced into the vessel 64 through opening holes 64b provided in the gas introducing path chamber 64a. Moreover, the coaxial cable 61 is connected to the vessel 64 and the antenna 62 is formed from a stainless rod having a diameter of 1.0 mm and which is covered with quartz. Antenna 62 is connected to the coaxial cable 61 and extends vertically in vessel 64 as can be seen in FIG. 17. Rather than quartz the cover for antenna 62 may be an insulator, fluoric resin, glass or SiC, etc., including materials which are resistive to heat and do not generate gas.

The shielding member 66 is like a mesh formed of stainless wire having a diameter of 0.5 mm and spaced at intervals of 5 mm, and the same is attached to extend vertically of vessel 64 at the blowing port 65. The hydrogen radical generator 60 is provided within the reactor vessel 26 at a position spaced 100 mm from the substrate 100.

The substrate 100 is set on the second electrode 27 and is held there by a substrate holder that has dimensions of 10×20 (not shown). Electrode 27 is grounded and film formation on substrate 100 is conducted using the following procedures.

Microwaves generated by microwave oscillator 21 are sent to antenna 62 by coaxial cable 61, and $H_2$ gas introduced through gas introducing pipe 63 is decomposed by the microwaves generated by the antenna 62 to form hydrogen radicals 10. The hydrogen radicals 10 are attracted to the substrate 100. Since shielding member 66 is attached to the hydrogen radical blowing port 65 of hydrogen radical generator 60, the microwaves are shielded by the shielding member 66 and do not leak to the outside of vessel 64. Meanwhile, the starting gas ($Si_2H_6 + C_3H_8$) is introduced through the starting gas introducing unit 114 and blows into deposition space 34. This starting gas is decomposed by the RF discharge generated between electrodes 29, 27 by the RF power from the RF source 31 and is deposited as an a-SiC:H film on the substrate 100 heated by the heater 28. The internal pressure in vacuum vessel 26 is adjusted by the exhausting systems 32, 33. While the starting gas is decomposed and deposited by high frequency discharge, the film surface is covered by hydrogen radicals 10 generated from the hydrogen radical generator 60 and thereby the structural density of the a-SiC:H film is improved. During formation of the film, the distance between the hydrogen radical generator 60 and the deposition space 34 (substrate 100) can be as short as about 100 mm without decomposition of starting gas by microwaves and without exposure of the substrate to the microwaves. Thus, leakage of microwaves from the hydrogen radical generator 60 is presented as described above and hydrogen radicals can be sent effectively to the deposition space. Moreover, the silicon system powder and film generated through decomposition of starting gas by RF discharge do not readily adhere to microwave antenna 62. The silicon powder is prevented from adhering to the antenna 62 by allowing the $H_2$ gas to flow from the vicinity of antenna 62 at a flow rate that is 10 to 1000 times as great as that of the starting gas and this effect becomes more apparent as a result of the use of the shielding member 66.

Actual film forming conditions used with such apparatus and the characteristics of the film thus formed are as follows.

The film forming conditions are that the pressure is 0.2 Torr, the substrate temperature is 250° C., the RF power is 100W, the $Si_2H_6$ flow rate is 2 SCCM, the $C_3H_8$ flow rate is 10 SCCM, the $H_2$ flow rate is 200 SCCM and the microwave power is 500W.

Figure 18:
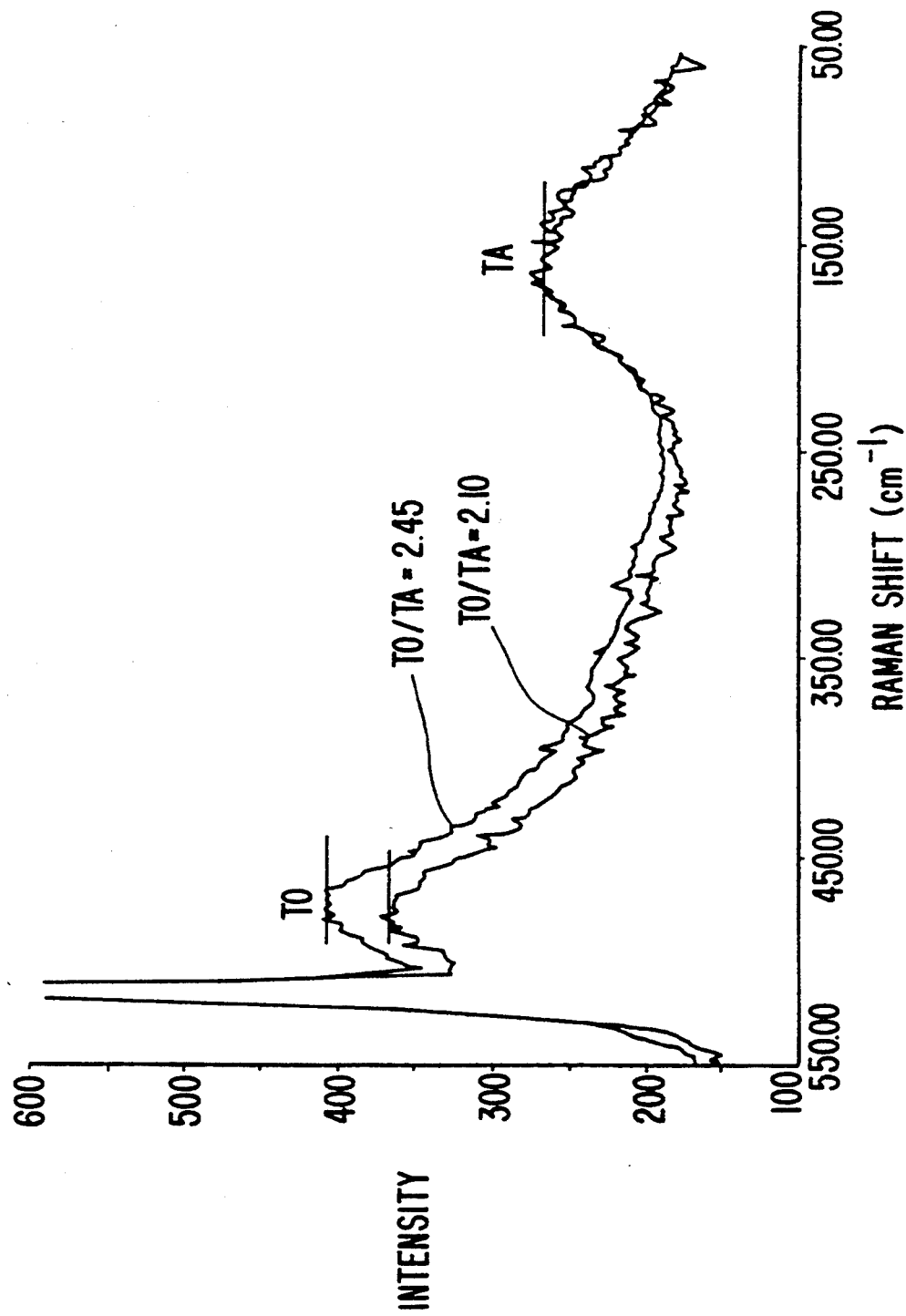
FIG. 18 is a graph showing laser Raman spectroscopy measurement results.

FIG. 18 is a graph showing the results of Raman spectroscopy measurement of an a-$Si_{1-x}C_x$:H film (x=0.6) formed using such conditions. The TO/TA peak intensity ratio represents small distortions in the Si-Si coupling structure in the film and in the symmetry thereof and larger TO/TA ratios indicate smaller distortions. From FIG. 18, it can be seen that the a-SiC:H film formed using the apparatus of FIGS. 16 and 17 of the present invention has a higher TO/TA ratio, is more dense and has better film qualities than the film formed by the prior art.

In the foregoing example, a flat type substrate was used and it is also possible to form a film on a substrate attached on a cylindrical substrate holder. In this case, the substrate is rotated during formation of the film. An a-Si photosensitive member using an a-SiC:H protective layer by an apparatus using such cylindrical substrate has a charging capability of 55 V/μm, does not show any blurring when left overnight in an atmosphere at 35° C. and 88% RH after continuous corona irradiation under the same conditions and also exhibits good moisture proof characteristics.

In the above procedures, a mesh shielding member is used, but the mesh may be replaced by other members for shielding the microwaves, such as, for example, rod like lead wires placed at certain intervals.

Figure 19:
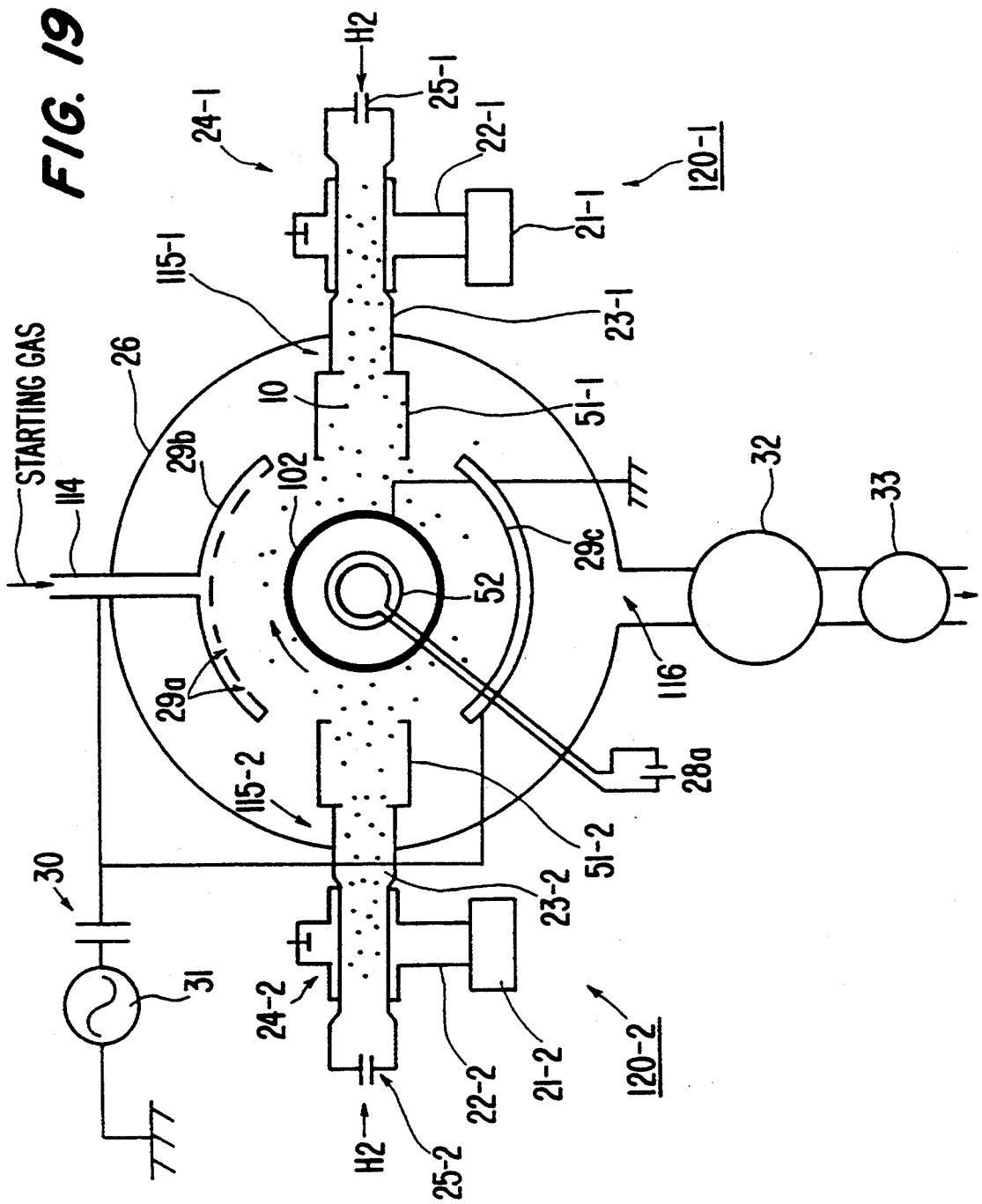
FIGS. 19 through 23 are schematic diagrams illustrating five additional alternative forms of apparatus which embody the principles and concepts of the invention.

FIG. 19 is a schematic diagram illustrating a fifth embodiment of the invention. This embodiment differs from the third embodiment illustrated in FIG. 13 in that a plurality of hydrogen radical generating units are provided so that the hydrogen radicals are sent to the substrate and deposition space from two or more directions through the inlet ports 115-1, 115-2.

The first and second hydrogen radical generating units 120-1, 120-2 have the same basic construction as the hydrogen radical generating unit 120 described in connection with FIG. 13 and the hydrogen radical introducing units 51-1, 51-2 are each the same as the unit 51 shown in FIG. 14.

In the embodiment at FIG. 19, since the hydrogen radicals are introduced from two or more directions to the substrate or deposition space, the hydrogen radicals are applied uniformly and therefore the density of the a-SiC:H film is much improved.

The following film forming conditions were used to form a surface protecting layer using the apparatus of FIG. 19.

Pressure: 0.2 Torr
Substrate temperature: 250° C.
RF power: 100W
Flow rate of $Si_2H_6$: 2 SCCM
Flow rate of $C_3H_8$: 10 SCCM
Flow rate of $H_2$: 200 SCCM
Microwave power: 500W For the total of 200 SCCM of H₂, 100 SCCM is respectively supplied through the hydrogen gas introducing pipes 25-1, 25-2 of the first and second hydrogen radical generating units 120-1, 120-2. The hydrogen in the respective streams of gas is decomposed in the plasma generating furnaces 24-1, 24-2, and becomes the hydrogen radicals 10 supplied from both directions to the substrate 102.

An a-Si photosensitive member comprising a surface protecting layer having a thickness of 0.2 μm formed of a-SiC:H under the conditions described above on a blocking layer of a high B doped a-Si:H film having a thickness of 0.56 μm and a low B doped a-Si:H film having a thickness of 10 μm did not generate blurring after continuous corona irradiation for two hours in an atmosphere of 35° C. and 80% RH and even after exposing the member overnight to such continuous corona irradiation.

Hydrogen radical introducing units 51-1, 51-2 of the construction shown in FIG. 14 are connected respectively at the end portions of quartz pipes 23-1, 23-2 and the hydrogen radicals 10 generated in the plasma generating furnaces 24-1, 24-2 by microwaves supplied from the microwave oscillators 21-1, 21-2 through the waveguides 22-1, 22-2 are distributed vertically over the substrate 102 and flow uniformly into the deposition space 34. A comparison of the TO/TA ratios for cases where the hydrogen radical introducing units 51-1, 51-2 are used and where such units are not used is made in Table 9.

TABLE 9

|  | Units used | Units not used |
|---|---|---|
| Upper part | 2.0 | 2.3 |
| Center | 2.4 | 2.4 |
| Lower part | 1.9 | 2.2 |

From Table 9, it is apparent that differences between the TO/TA ratios at the upper part, center part and lower part of the substrate can be reduced by using the opposed introducing units 51-1, 51-2.

Figure 20:
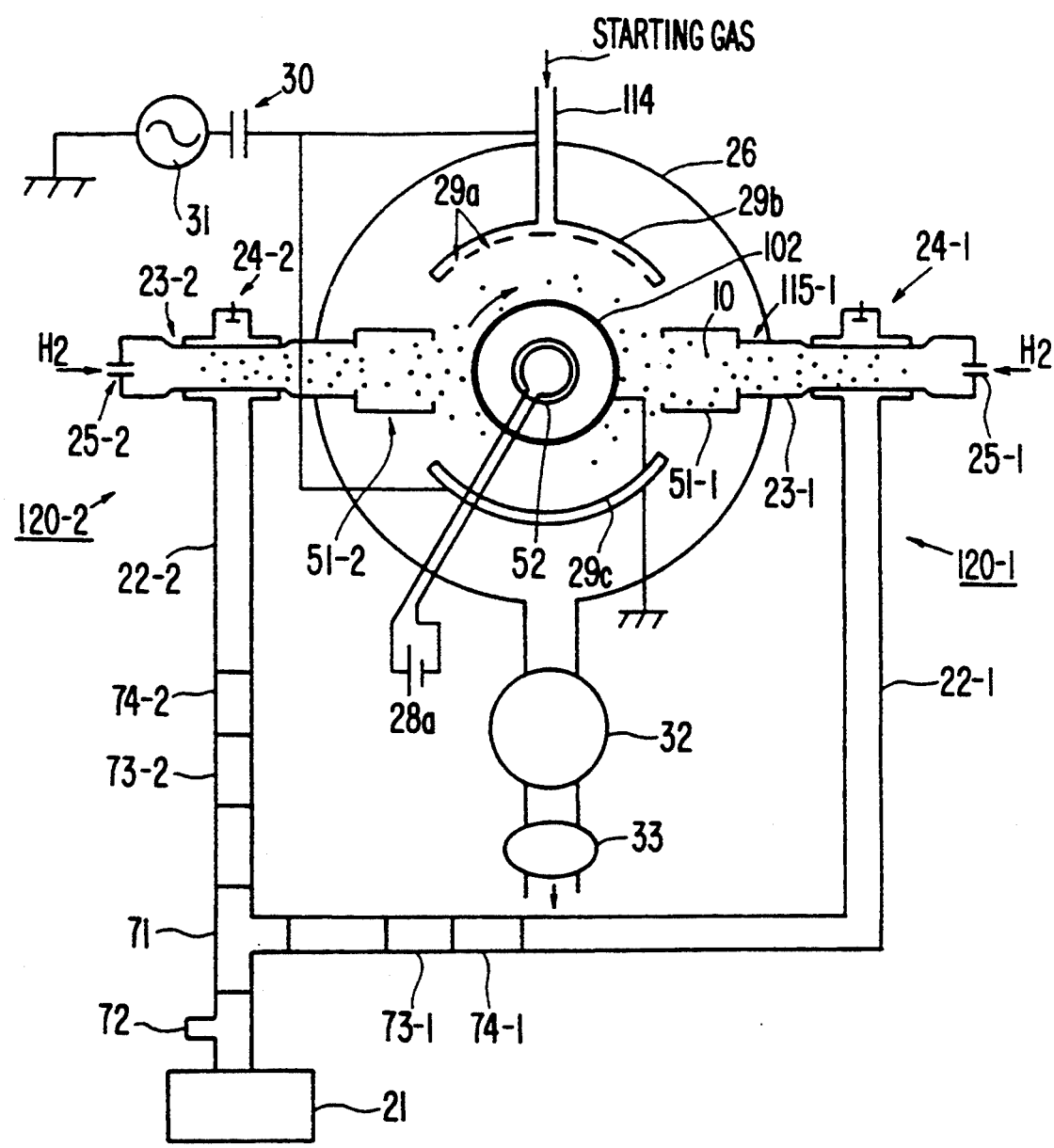

FIG. 20 is a schematic diagram illustrating a sixth embodiment of the invention. The apparatus of FIG. 20 is different from the fifth embodiment shown in FIG. 19 in that a single microwave oscillator is used in common for two hydrogen radical generating units 120-1, 120-2.

As shown in FIG. 20, the microwave output from single microwave oscillator 21 passes an isolator 72 and is then divided by a microwave distributor 71 to the waveguides 22-1, 22-2 of the hydrogen radical generating units 120-1, 120-2.

The waveguides 22-1, 22-2 are provided with power motors 73-1, 73-2 and matching units 74-1, 74-2. Moreover, the microwave power of microwave oscillator 21 is 800W.

With such construction, since the period of the microwave oscillator 21 is the same in both hydrogen radical generating units 120-1, 120-2, reflections caused by deviations of period increase and therefore the plasma can be kept in a stable condition.

Accordingly, this embodiment can be used to provide a stable film forming operation for a long period of time.

In the arrangement shown in FIG. 20, the surface protecting layer forming conditions are set such that the pressure is 0.2 Torr, the substrate temperature is 250° C., the RF power is 100W, the $Si_2H_6$ flow is 2 SCCM, the $C_3H_3$ flow is 10 SCCM, the $H_2$ flow is 200 SCCM and the microwave power is 800W. Moreover, 100 SCCM of $H_2$ is supplied from each of the two directions for the total flow of 200 SCCM of $H_2$ as in the case of the embodiment of FIG. 5.

As a result, reflection was reduced to ½ to ⅓ of that which was experienced using two microwave oscillators and unstable operation created by senodic plasma generation is eliminated. Thus, continuous film formation for a long period of time can now be realized.

The blocking layer is formed on the cylindrical Al substrate as a higher B doped a-Si:H film having a thickness of 0.56 μm, while the photosensitive layer is formed as a lower B doped a-Si:H film having a thickness of 10 μm and the surface protecting layer is deposited to a thickness of 0.15 μm under the film forming conditions described above. The a-Si:H film having a surface protecting layer thusly formed did not generate blurring after continuous corona irradiation for two hours in an atmosphere of 35° C. and 80% RH and even after overnight exposure to such continuous irradiation.

Figure 21:
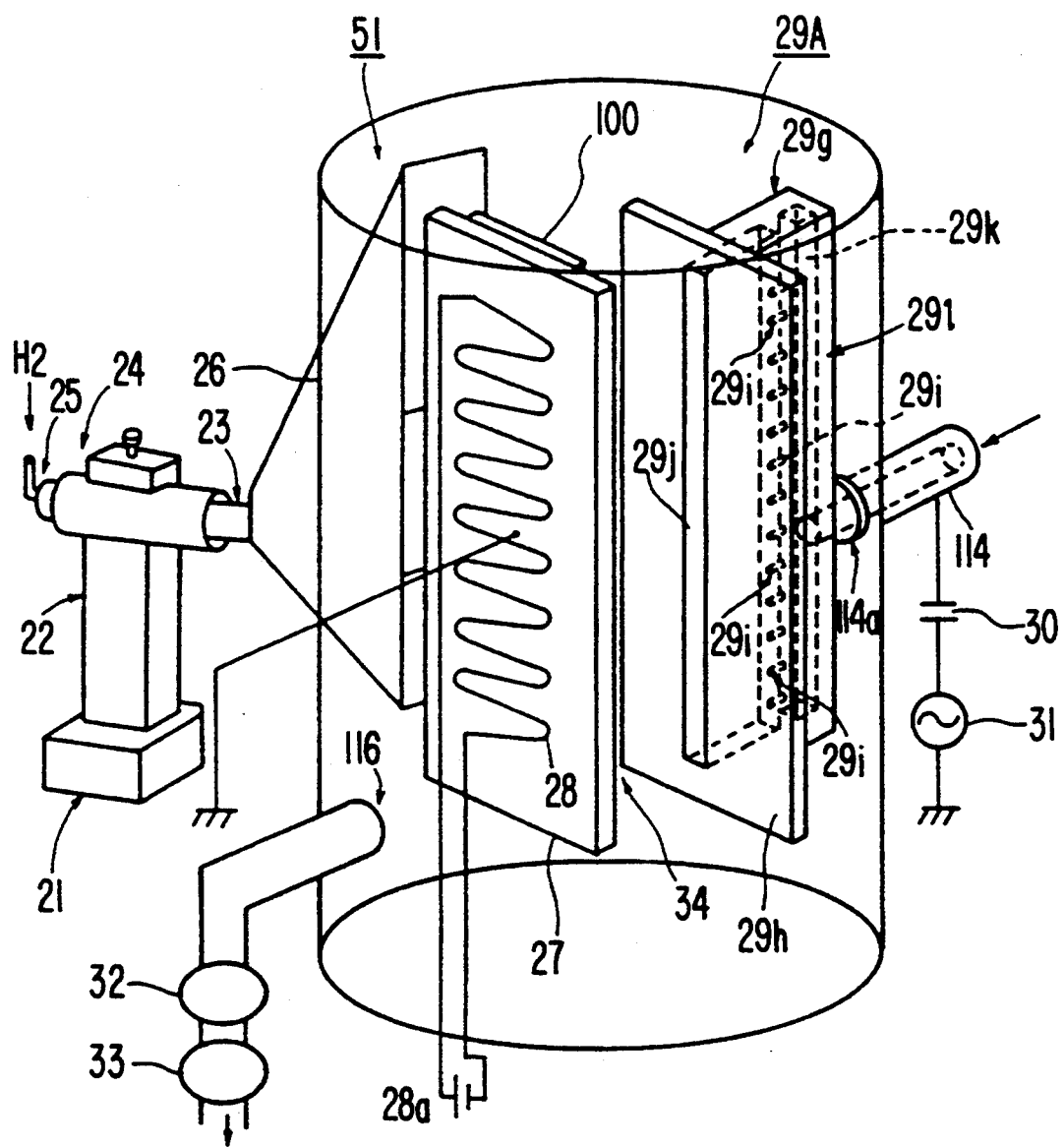

FIG. 21 illustrates a modification of the thin film formation apparatus 110 of FIG. 11. In FIG. 21, the features similar to those of FIG. 11 are indicated by the same reference numerals. The modified apparatus is the same as shown in FIG. 11 except that the first electrode 29 is replaced with a hollow cathode electrode 29A and the hydrogen radical introducing unit 51 has the structural configuration illustrated in FIG. 14.

In this embodiment, the hollow cathode electrode 29A includes a rectangular flat portion 29h and an upright portion 29g integrally projected from the flat portion 29h along the longitudinal axis thereof. A rectangular hollow space 29j formed in upright portion 29g extends through the flat portion 29h and opens at the discharge surface thereof.

As can be seen in FIG. 21, the upright portion 29g has a plurality of opening holes 29i formed at the head 291 thereof in vertical alignment with one another. The electrode 29A is suspended from the side wall of the reactor vessel 26.

In particular, the head 291 of the upright portion 29g projects through the side wall of the reactor vessel 26 and is attached to the side wall of the reactor vessel 26 through the intermediary of an insulator (not shown), and a header element 114a by which the inlet port 114 is defined is mounted on the head 291 of the upright portion 29g in such a manner that the inlet port 114 is in communication with a head space 29k which in turn communicates with the hollow space 29j through the opening holes 29i.

In operation, air is first drawn from the reactor vessel 26 through the outlet port 116 by the vacuum pumps 32, 33 until the pressure in the reactor vessel 26 is lower than $10^{-3}$ Torr. Substrate 100 is then heated to a predetermined temperature by electric heater 28 while the starting gas is continuously introduced into the reactor vessel 26 through the inlet port 114, the opening holes 29i, and the hollow space 29j, so that the pressure in vessel 26 is maintained at a predetermined level of from about 0.01 to about 0.3 Torr. The vacuum pumps 32, 33 are continuously driven.

A predetermined RF voltage is then applied between the first and second electrodes 29A and 27 by the RF electric source 31 so as to cause an RF discharge therebetween, and the electrons generated by the RF discharge collide with the starting gas molecules so that a plasma zone is formed between the first and second electrodes 29A and 27. At the beginning of the RF discharge, the electrons which vibrate in the vicinity of the first electrode 29A are captured by the first electrode 29A due to the existence of the blocking capacitor 30, so that the potential of the first electrode 29A is self-biased toward the negative side. If the flat portion of second electrode 27 which faces portion 29h of first electrode 29A is wider than flat portion 29h of the first electrode 29A, i.e., if the area of the flat portion of electrode 27 that faces portion 29h is smaller than the area of flat portion 29h, the capture of electrons by first electrode 29A is facilitated.

When the first electrode 29A becomes saturated with captured electrons, the first and second electrodes 29A and 27 behave respectively as a cathode and an anode that have a direct current voltage applied therebetween, so that the electrons existing in the hollow space 29j are rapidly vibrated by the electrical repulsion which the electrons receive from the wall of the hollow space.

Thus, the probability of collision between the electrons and the starting gas molecules in the hollow space 29j is considerably enhanced, so that a high density plasma is generated in the central portion of the discharge zone, which is in the vicinity of the opening of hollow space 29j.

As a result, the starting gas is introduced directly into a high density plasma and the active species are more efficiently dissociated from the starting gas than would be the case in a conventional RF discharge plasma-assisted CVD process. Moreover, hydrogen radicals (·H) are generated when the microwave oscillator 21 is operated simultaneously with the application of RF power, and such radicals are supplied to the plasma zone 34 formed between the first and second electrodes 29A, 27 through the hydrogen radical introducing unit 51.

Figure 22:
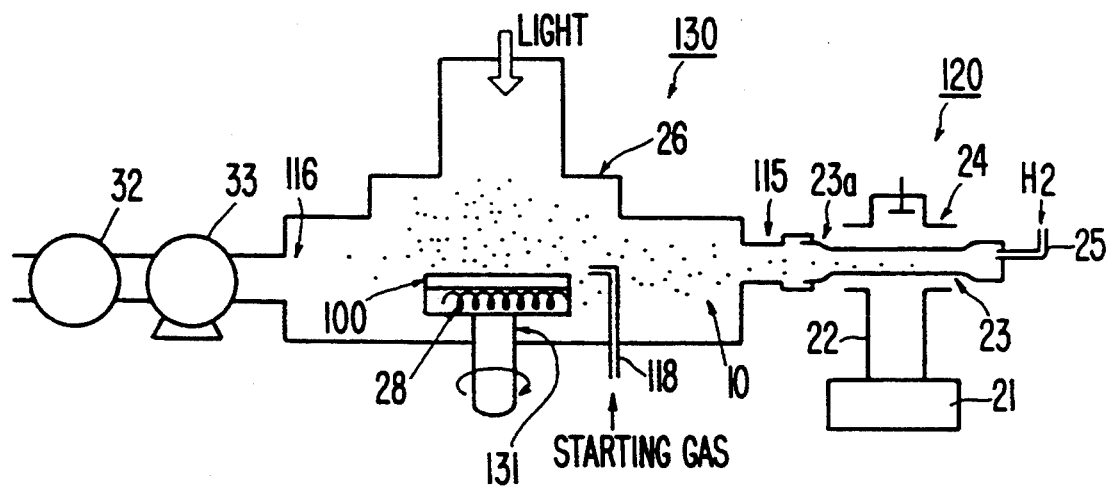

FIG. 22 is a schematic diagram illustrating an eighth embodiment of the invention. In this embodiment, the hydrogen radical generating unit 120 is applied to an optical CVD apparatus 130.

Optical CVD apparatus 130 includes a reactor vessel 26, an introducing pipe 118 for supplying the starting gas to the reactor vessel 26, a vacuum pump including a mechanical booster pump 32 connected to the outlet port 116 and a rotary pump 33 for evacuating the reactor vessel 26, a heater 28 for heating the substrate 100, a substrate holder 131 which may be rotated together with the heater 28 while it is holding the substrate 100 and a light source (not shown) which irradiates the substrate holder 131 with light from the exterior of reactor vessel 26 to decompose the starting gas introduced from the introducing pipe 118 to produce a plasma condition.

The end portion 23a of the quartz pipe 23 of the hydrogen radical generating unit 120 is connected to the vessel 26 of the optical CVD apparatus 130 by way of an inlet port 115 in the same way that such connection is made in the case of the embodiment shown in FIG. 4.

Therefore, the optical CVD apparatus 130 can supply a large amount of hydrogen radicals in the vicinity of the substrate holder 131.

Figure 23:
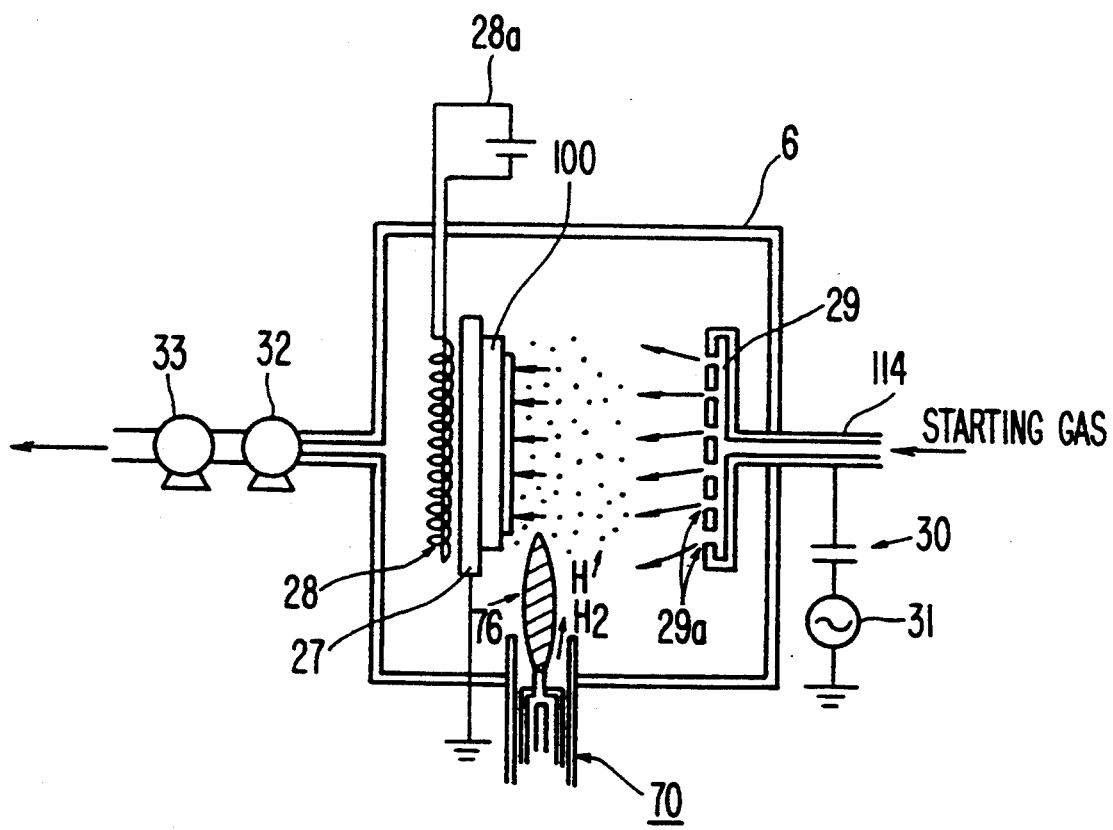

FIG. 23 is a schematic diagram illustrating the configuration of a ninth embodiment of the invention. In FIG. 23, the hydrogen radical generating apparatus is identified by the reference numeral 70. The components that are similar to those of the prior art are designated by similar reference numerals as set forth above.

Figure 24:
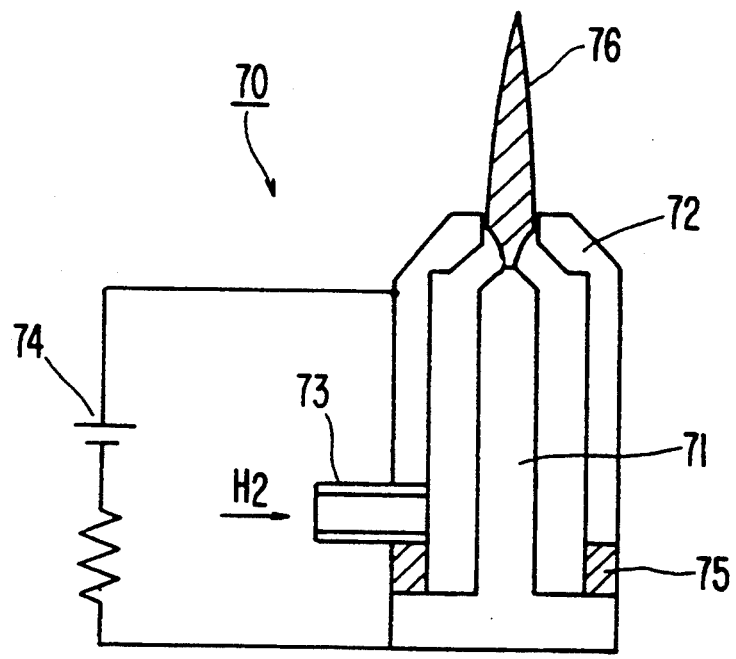
FIG. 24 is a schematic diagram illustrating the hydrogen radical generating apparatus used in connection with the apparatus of FIG. 23.

As can be seen in FIG. 24, the hydrogen radical generating apparatus 70 in this case is an arc discharge device having a cathode 71, an anode 72 and an $H_2$ gas supply port 73. The cathode 71 and anode 72 are connected with the power source 74 and the same are separated by an insulator 75. This embodiment uses an arc discharge hydrogen radical generating apparatus 70 to generate the hydrogen radicals. The apparatus 70 enables the reduction of the discharge sustaining voltage to about 1/10 immediately after it increases rapidly when a current higher than the glow discharge is supplied from the power source 74. The cathode 71 is heated until it turns red, and emits hot electrons. Thus, the plasma is in a thermal equilibrium condition wherein the electron temperature becomes almost equal to the gas temperature and whereby the $H_2$ gas is dissociated into an almost 100% plasma condition. A gas having a higher hydrogen radical content than the gas obtained using microwaves can be obtained by extending arc rod 76 up to an area in the vicinity of the substrate 100.

In the respective embodiments described above, disilane $Si_2H_6$, propane $C_3H_8$ and diborane $B_2H_6$ are used as the starting gas, but other gases which may be described by the general expressions $Si_nH_{3n}$, $C_nH_{2n+2}$ or $B_nH_{3n}$ may also be used in combination.

It should also be understood that the foregoing descriptions relate only to the preferred embodiments of the invention, and that it is intended that the claims should cover all changes and modifications of the examples of the invention herein chosen for the purpose of the disclosure, which do not constitute departures from the spirit and scope of the invention.

We claimed:

1. A method for forming a dense, carrier blocking, thin protective film of a hydrogenated amorphous material on a substrate, said material containing an ingredient to reduce surface wettability, said method comprising the steps of:
   (a) forming said film by generating a plasma of a starting gas suitable for forming said material within a deposition space where a substrate is positioned under vapor deposition conditions;
   (b) generating hydrogen radicals by decomposing a hydrogen gas; and
   (c) reducing the quantity of dangling bonds at the surface of said amorphous material film to thereby increase the density of said film by introducing a sufficient amount of said hydrogen radicals into said deposition space in the proximity of the substrate to cover the surface of the amorphous material film as it forms.

2. A thin film forming method as set forth in claim 1, wherein said hydrogen radicals are introduced into said deposition space from a plurality of directions.

3. A method for forming an a-Si photosensitive member comprising the steps of:
   (a) placing a conductive substrate to be used for electrophotography within a reactor vessel;
   (b) reducing the pressure within the reactor vessel;
   (c) introducing a first starting gas including $Si_nH_n$ gas and $B_nH_{3n}$ gas into the reduced pressure reactor vessel and generating a plasma from the first starting gas to form a boron doped a-Si:H photosensitive member on the substrate;
   (d) introducing a second starting gas including $Si_nH_n$ gas and $C_nH_{2n+2}$ gas into the reduced pressure reactor vessel and generating a plasma from the second starting gas to form a surface protecting layer of a-SiC:H on said a-Si:H photosensitive member, said surface protecting layer containing a carrier injection blocking and surface wettability reducing amount of carbon; and (e) reducing the quantity of dangling bonds at the surface of said surface protecting layer to thereby increase the density of said layer by introducing a sufficient amount of hydrogen radicals into the reactor vessel in the proximity of the photosensitive member to cover the surface of the protecting layer as it forms.

* * * * *

UNITED STATES PATENT AND TRADEMARK OFFICE
CERTIFICATE OF CORRECTION

PATENT NO. : 5,447,816

DATED : September 5, 1995    Page 1 of 2

INVENTOR(S) : JUN KODAMA et al.

It is certified that error appears in the above-indentified patent and that said Letters Patent is hereby corrected as shown below:

Title Page, under Foreign Patent Documents", line 2, delete "0242317" and substitute --0241317--.

Title Page, Second Column, line 2, delete "25-Aug. 14, 1984" and substitute --25-Aug. 1984--.

Column 5, line 15, delete "($C_3H_6$)" and substitute --$C_3H_8$--.

Column 6, line 39, delete "$B_2H_6$becomes" and substitute --$B_2H_6$ becomes--.

Column 9, line 20, after "system" insert --shown in Fig. 5(b), $C_3H_8$ is decomposed to form carbon atoms (C)--.

UNITED STATES PATENT AND TRADEMARK OFFICE
CERTIFICATE OF CORRECTION

PATENT NO.   : 5,447,816
DATED        : September 5, 1995
INVENTOR(S)  : JUN KODAMA et al.

It is certified that error appears in the above-indentified patent and that said Letters Patent is hereby corrected as shown below:

Column 9, lines 21 and 22, delete "shown in Fig. 5(b), $C_3H_8$ is decomposed to form carbon atoms (C)".
        line 67, should read --Flow rate of $Si_2H_6$: 2.2 SCCM--.
        line 68, delete "$H_6$: 2.2 SCCM".
Column 10, line 2, delete line.
        line 24, after "and" insert --80%--.
Column 17, line 1, delete "Ha" and substitute --$H_2$--.

Signed and Sealed this

Sixth Day of August, 1996

BRUCE LEHMAN

*Attest:*

*Attesting Officer*      *Commissioner of Patents and Trademarks*